United States Patent
Oku

(10) Patent No.: US 7,579,903 B2
(45) Date of Patent: Aug. 25, 2009

(54) POWER-SOURCE POTENTIAL CONTROL CIRCUIT AND METHOD OF TRIMMING POWER-SOURCE POTENTIAL

(75) Inventor: Satoru Oku, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 32 days.

(21) Appl. No.: 11/493,535

(22) Filed: Jul. 27, 2006

(65) Prior Publication Data

US 2007/0041261 A1 Feb. 22, 2007

(30) Foreign Application Priority Data

Aug. 3, 2005 (JP) ............................. 2005-224979

(51) Int. Cl.
*H03K 3/01* (2006.01)
(52) U.S. Cl. ..................... 327/538; 327/534; 327/536
(58) Field of Classification Search .......... 327/534–538
See application file for complete search history.

(56) References Cited

U.S. PATENT DOCUMENTS 6,017,862 A * 1/2000 Doyel et al. ................ 510/163

6,404,274 B1 * 6/2002 Hosono et al. .............. 327/538

FOREIGN PATENT DOCUMENTS

| JP | 2002-318265 | 10/2002 |
|----|-------------|---------|
| JP | 2002-368113 | 12/2002 |

* cited by examiner

*Primary Examiner*—Dinh T. Le
(74) *Attorney, Agent, or Firm*—McGinn IP Law Group, PLLC

(57) ABSTRACT

A power-source potential control circuit has: an output terminal outputting a control signal to a power-source generating device which generates a power-source potential in accordance with the control signal; an input terminal connected to an output of the power-source generating device; and a control unit configured to make a comparison between a trimming potential depending on a first potential at the input terminal and a predetermined reference potential and to output the control signal corresponding to a result of the comparison. In a trimming operation mode, the control unit changes the trimming potential in accordance with the result of the comparison.

17 Claims, 16 Drawing Sheets

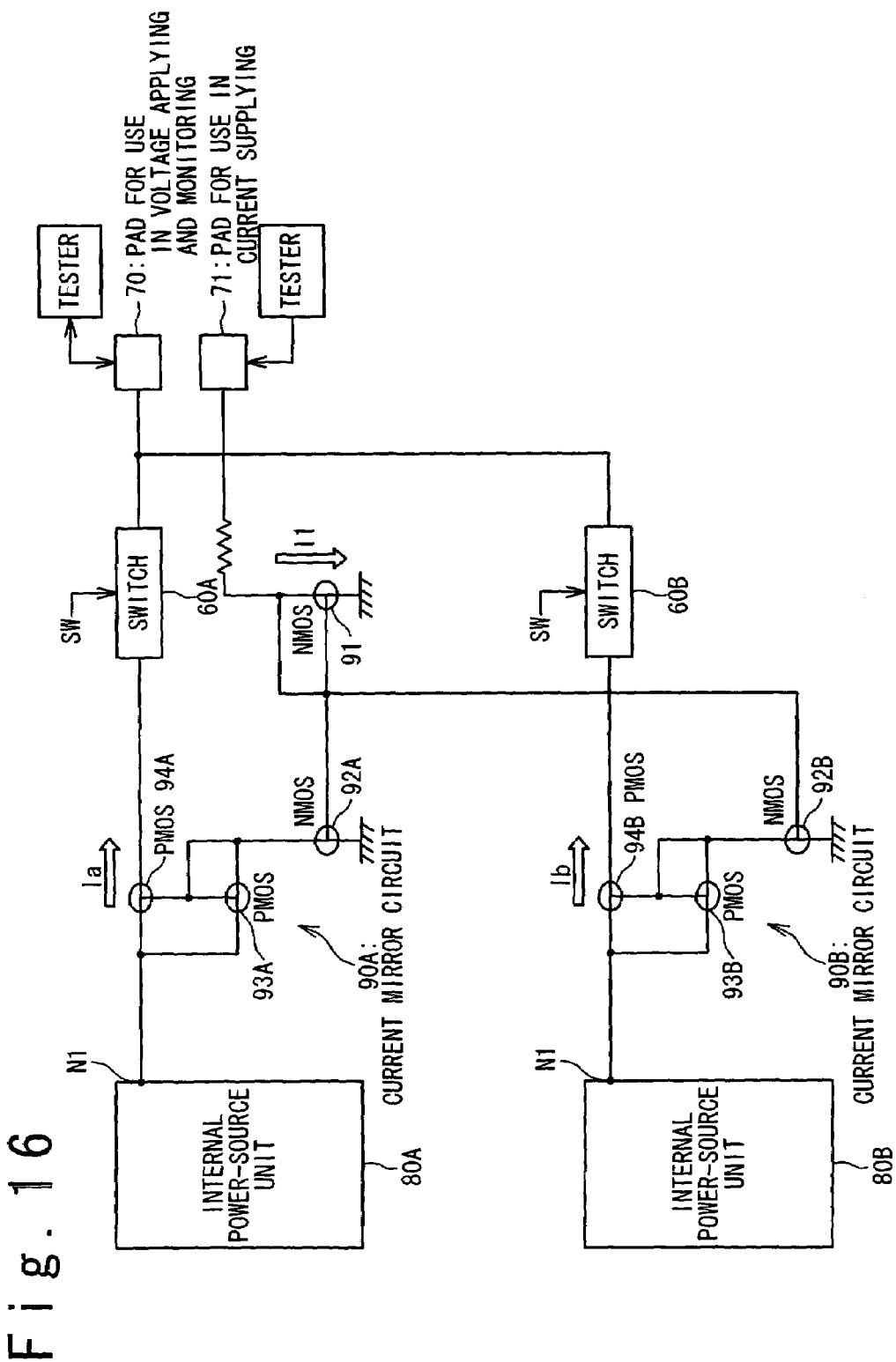

POWER-SOURCE POTENTIAL CONTROL CIRCUIT AND METHOD OF TRIMMING POWER-SOURCE POTENTIAL

BACKGROUND OF THE INVENTION

1. Field of the Invention

The present invention relates to a semiconductor integrated circuit device. In particular, the present invention relates to a circuit for controlling a power-source potential of the semiconductor integrated circuit device, and a method of trimming the power-source potential.

2. Description of the Related Art

In a semiconductor integrated circuit device, a specific potential used in the device is often generated by using a charge pump and the like. In a case of a flash memory, for example, a specific potential used for data programming is generated in the device. Such a specific potential is hereinafter referred to as a power-source potential or an internal potential. The internal potential is generated based on a reference potential, and the reference potential may vary between semiconductor chips due to manufacturing variability. It is therefore necessary to fine adjust the internal potential for every semiconductor chip. Such an adjustment of the internal potential is referred to as a "trimming".

FIG. 1 shows a configuration of a conventional semiconductor integrated circuit device. A charge pump 101 supplies an internal potential V1 to a first node N1. A resistance potential divider 104 is connected to the first node N1. A potential V2 at a second node N2 is determined by the internal potential V1 and a division ratio of the resistance potential divider 104. A comparator 105 makes a comparison between the potential V2 at the second node N2 and a predetermined reference potential VREF. The result of the comparison is fed-back to the charge pump 101. The charge pump 101 outputs the internal potential V1 such that the potential V2 becomes equal to the reference potential VREF.

Here, for example, the reference potential VREF may vary between manufactured semiconductor chips. It is therefore necessary to adjust the division ratio of the resistance potential divider 104 for every manufactured semiconductor chip and hence to equalize the internal potentials V1 with respect to all the semiconductor chips. For the purpose of adjusting (trimming) the division ratio, the semiconductor integrated circuit device is provided with a trimming decoder 103. The trimming decoder 103 decodes a code referred to as a "trimming code" and sets the division ratio of the resistance potential divider 104 to a value corresponding to the trimming code. When the trimming code is changed, the division ratio varies and hence the internal potential V1 also varies. By adjusting the trimming code for every semiconductor chip, it is possible to equalize the internal potentials V1 to a desired value, namely, it is possible to eliminate the influence of the variation of the reference potential VREF.

More specifically, at the time of the trimming, a switch 106 is turned ON by a switch open/close signal SW, and hence the internal potential V1 appears at a pad 107 for use in voltage monitoring. Also, a plurality of kinds of trimming codes are supplied to the trimming decoder 103 from a tester. By switching the trimming code and monitoring the internal potentials V1 output from the pad 107 for use in voltage monitoring, it is possible to determine an optimum trimming code corresponding to a desired internal potential V1. Such the trimming is performed with respect to every manufactured semiconductor chip. The purpose of the trimming is to determine the optimum trimming code for every manufactured semiconductor chip. At a time of a normal operation, the above-mentioned optimum trimming code determined in the trimming is used. As a result, the charge pump 101 of each semiconductor chip operates to output the desired internal potential V1.

According to the above-explained conventional technique, it is necessary to switch the trimming code while monitoring the output potential output from the pad 107, which leads to an increase in a time required for the trimming operation. A technique for making the trimming easy and suppressing the time required for the trimming is disclosed in, for example, Japanese Laid-Open Patent Application (JP-P2002-318265A). According to the technique described in the patent document, a built-in CPU executes the trimming in accordance with a built-in program in a self-sufficient manner.

As another technique for making the trimming easy, a semiconductor device disclosed in Japanese Laid-Open Patent Application (JP-P2002-368113A) is publicly known. FIG. 2 shows a configuration of a trimming circuit (tuning circuit) in the patent document. An internal potential IntVCC is generated by an internal power-source potential generating circuit 201. The level of the internal potential IntVCC varies in accordance with a trimming code (P0-P3) of 4 bits. At the time of the trimming, a built-in signal generating circuit 202 supplies a plurality of trimming codes sequentially to the internal power-source potential generating circuit 201. A comparator 203 makes a comparison between each internal potential IntVCC and a reference potential VR, and outputs a signal φ indicative of a result of the comparison to a memory circuit 204. The output signals φ associated with all of the plurality of trimming codes are stored in the memory circuit 204. By analyzing data φT stored in the memory circuit 204, it is possible to determine an optimum trimming code with which a desired internal potential IntVCC is generated.

SUMMARY OF THE INVENTION

The present invention has recognized the following point. In the conventional technique shown in FIG. 2, the signal generating circuit 202 supplies all kinds of trimming codes sequentially to the internal power-source potential generating circuit 201 at the time of the trimming. The comparator 203 compares respective internal potentials IntVCC corresponding to the all kinds of trimming codes with the reference potential VR. Thus, the internal power-source potential generating circuit 201, the signal generating circuit 202 and the comparator 203 need to operate for all kinds of the trimming codes during each trimming operation. The purpose of the trimming is to determine one optimum trimming code as described above, and the conventional trimming method may result in unnecessary electric power consumption.

In an aspect of the present invention, a power-source potential control circuit is provided with an output terminal, an input terminal and a control unit. The output terminal is for outputting a control signal to a power-source generating device which generates a power-source potential in accordance with the control signal. The input terminal is connected to an output of the power-source generating device and can receive an output potential output from the power-source generating device. The control unit makes a comparison between a trimming potential depending on a first potential at the input terminal and a predetermined reference potential, and outputs the control signal corresponding to a result of the comparison through the output terminal. In a trimming operation mode, the control unit changes the above-mentioned trimming potential in accordance with the result of the comparison.

For example, the control unit has a trimming code generating circuit and a comparator. The trimming code generating circuit outputs a trimming code used for trimming the power-source potential. The above-mentioned trimming potential varies depending on the first potential and the trimming code. The comparator makes a comparison between the trimming potential and the predetermined reference potential, and outputs a comparison result signal indicative of the result of the comparison. For example, the comparator outputs a first signal as the comparison result signal, if the predetermined reference potential is higher than the trimming potential. On the other hand, the comparator outputs a second signal as the comparison result signal, if the predetermined reference potential is lower than the trimming potential.

The comparison result signal is input as the above-mentioned control signal to the power-source generating device. Further, the comparison result signal is fed-back to the trimming code generating circuit. In the trimming operation mode, the trimming code generating circuit changes or holds the trimming code in accordance with the comparison result signal. Consequently, the trimming potential is changed or held in accordance with the trimming code. For example, when receiving the first signal as the comparison result signal, the trimming code generating circuit changes the trimming code such that the trimming potential is increased. The comparison result signal switches from the first signal to the second signal while the trimming potential is gradually increased. When receiving the second signal, the trimming code generating circuit holds the trimming code as of then. The trimming code and hence the trimming potential are no more changed.

As described above, the trimming code generating circuit changes the trimming code in order, while stops the change of the trimming code at the time when receiving the second signal from the comparator. Therefore, it is not necessarily that all kinds of trimming codes are generated. It is not necessary to generate trimming potentials with regard to all kinds of trimming codes. As a result, electric power consumption at the time of the trimming is reduced. This is because the comparison result signal is fed-back to the trimming code generating circuit. It should be noted that the trimming code which is held in response to the second signal is the optimum trimming code. In a normal operation mode, the optimum trimming code is used and thus a desired power-source potential corresponding to the optimum trimming code can be generated.

According to the semiconductor integrated circuit device of the present invention, it is possible to reduce electric power consumption at the time of the trimming of the internal potential (power-source potential).

BRIEF DESCRIPTION OF THE DRAWINGS

The above and other objects, advantages and features of the present invention will be more apparent from the following description taken in conjunction with the accompanying drawings, in which:

FIG. 16 is a block diagram showing a configuration of a semiconductor integrated circuit device according to a fifth embodiment of the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. First Embodiment 1-1. Schematic Configuration and Operation

Figure 3:
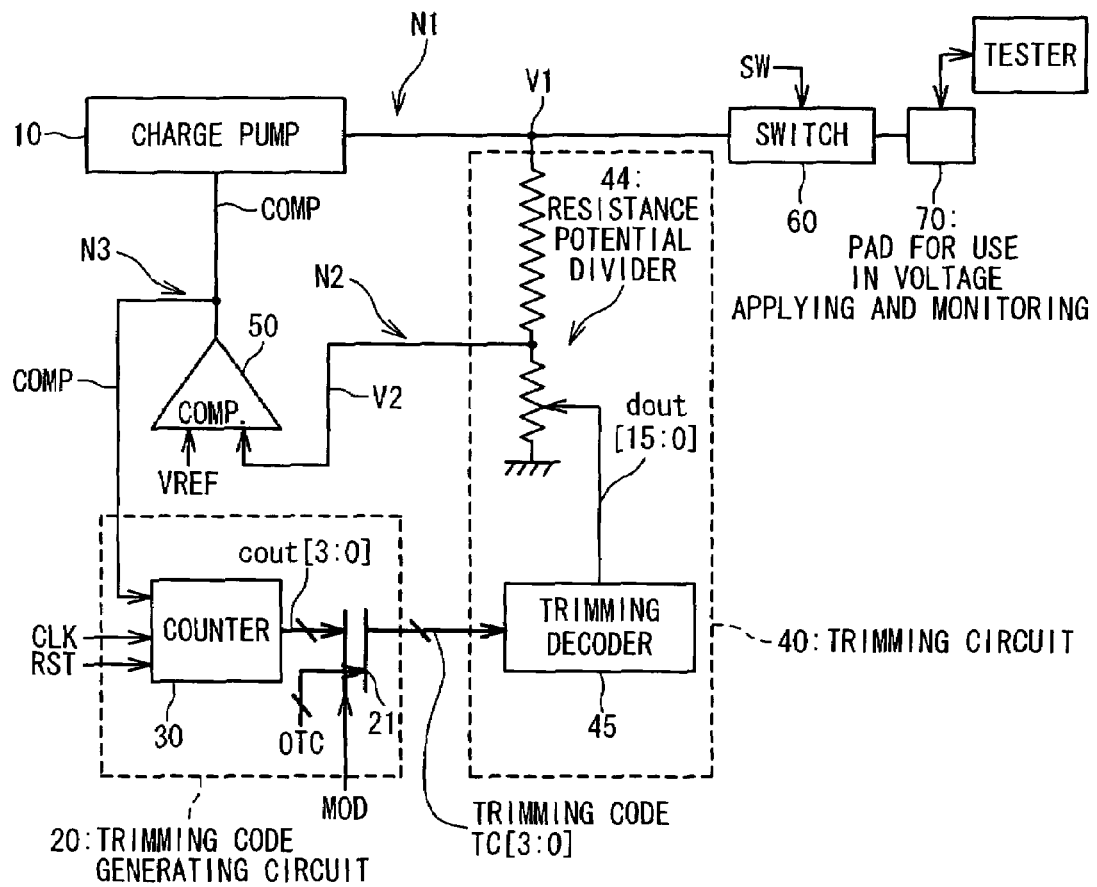
FIG. 3 is a block diagram showing a configuration of a semiconductor integrated circuit device according to a first embodiment of the present invention.

FIG. 3 is a block diagram schematically showing a configuration of a semiconductor integrated circuit device according to a first embodiment of the present invention. In particular, shown in FIG. 3 is a configuration relating to a power-source unit for supplying an internal potential (power-source potential). The semiconductor integrated circuit device is provided with a charge pump 10, a trimming code generating circuit 20, a trimming circuit 40, a comparator 50, a switch 60 and a pad 70 for use in voltage applying and monitoring.

The charge pump 10 generates the internal potential and supplies the internal potential to a first node N1. The trimming code generating circuit 20 generates a trimming code TC and outputs the trimming code TC to the trimming circuit 40. The trimming circuit 40 is connected to the first node N1 and the trimming code generating circuit 20. The trimming circuit 40 adjusts (trims) a potential V2 at a second node N2 based on a potential V1 at the first node N1 and the trimming code TC. More specifically, the trimming circuit 40 changes the potential V2 at the second node N2 between the potential V1 and a ground potential GND in accordance with the trimming code TC. The potential V2 at the second node N2 is hereinafter referred to as a "trimming potential V2". The trimming potential V2 varies depending on the trimming code TC and the potential V1 at the first node N1.

The comparator (comparing circuit) 50 makes a comparison between the trimming potential V2 at the second node N2 and a predetermined reference potential VREF. In addition, the comparator 50 outputs a comparison result signal COMP indicative of a result of the comparison to a third node N3. For example, if the reference potential VREF is higher than the trimming potential V2, the comparison result signal COMP is "Low (first signal)". On the other hand, if the reference potential VREF is lower than the trimming potential V2, the comparison result signal COMP is "High (second signal)". The comparison result signal COMP is fed-back to the charge pump 10. The charge pump 10 executes or stops boosting in accordance with the received comparison result signal (control signal) COMP. For example, in a case when the comparison result signal COMP is "Low", the charge pump 10 carries out the boosting. On the other hand, in a case when the comparison result signal COMP is "High", the charge pump 10 stops the boosting. Consequently, the internal potential output from the charge pump 10 to the first node N1 is controlled such that the trimming potential V2 becomes substantially equal to the reference potential VREF.

Here, for example, the reference potential VREF may vary between manufactured semiconductor chips. The variation of the reference potential VREF causes variation of an output potential of the charge pump 10, namely, variation of the internal potential. In order to eliminate the influence of the variation of the reference potential VREF, the trimming code TC is adjusted for every semiconductor chip. The trimming code TC is, for example, a 4-bit binary code. In this case, it is possible to adjust the output potential of the charge pump 10 between 16 levels by using the 4-bit trimming code TC[3:0]. It can be also said that the trimming code is for trimming (adjusting) the internal potential V1.

In the trimming, one trimming code TC with which a desired internal potential V1 can be achieved is determined for every semiconductor chip. The one trimming code TC is referred to as an "optimum trimming code OTC" hereinafter. It can be also said that the trimming is an operation for selecting an optimum trimming code OTC corresponding to the desired internal potential V1 with respect to every chip.

The operation of the trimming code generating circuit 20 outputting the trimming code TC differs between in a trimming operation mode and in a normal operation mode. In the trimming operation mode, the trimming code generating circuit 20 generates and outputs a plurality kinds of trimming codes TC, because it is necessary to determine an optimum trimming code OTC from the plurality kinds of trimming codes TC. On the other hand, in the normal operation mode, the trimming code generating circuit 20 only outputs the determined optimum trimming code OTC. The operation mode of the trimming code generating circuit 20 can be designated by a mode select signal MOD. For example, in a case where the mode select signal MOD is set to "High", the trimming code generating circuit 20 operates in the "trimming operation mode". On the other hand, in a case where the mode select signal MOD is set to "Low", the trimming code generating circuit 20 operates in the "normal operation mode".

First, let us overview the trimming operation mode. As described above, an optimum trimming code OTC corresponding to the desired internal potential V1 is determined at the time of the trimming. According to the present embodiment, it is not necessary to change the trimming code TC while monitoring the potential V1 at the first node N1, which is different from the conventional technique shown in FIG. 1. According to the present embodiment, the potential V1 at the first node N1 is set to a desired potential. Since the output potential of the charge pump 10 changes in time, the potential V1 at the first node N1 is forced to be fixed by another means. For that purpose, the first node N1 is connected through the switch 60 to the pad 70 for use in voltage applying and monitoring according to the present embodiment. At the time of the trimming, the switch 60 is turned ON by the switch open/close signal switch SW. The pad 70 for use in voltage applying and monitoring is connected to a tester, and the potential V1 at the first node N1 is set to a predetermined desirable value by using the pad 70 for use in voltage applying and monitoring. Consequently, it is not necessary to consider the operation of the charge pump 10 in the trimming operation mode. Once the optimum trimming code OTC is determined, the output potential of the charge pump 10 is automatically controlled to the above-mentioned desirable value at the time of the normal operation mode.

At the time of the trimming operation mode, the trimming code generating circuit 20 is capable of outputting a plurality kinds of trimming codes TC to the trimming circuit 40. As mentioned above, the trimming potential V2 output by the trimming circuit 40 basically depends on both of the trimming code TC and the potential V1 at the first node N1. During the trimming operation, however, the potential V1 at the first node N1 is fixed and thus the trimming potential V2 varies in accordance with only the change in the trimming code TC. The comparator 50 makes a comparison between the varying trimming potential V2 and the predetermined reference potential VREF, and outputs the comparison result signal COMP to a third node N3.

According to the present embodiment, the trimming code generating circuit 20 is connected to the third node N3, and the comparison result signal COMP is supplied to the trimming code generating circuit 20. That is to say, the comparison result signal COMP is fed-back not only to the charge pump 10 but also to the trimming code generating circuit 20 according to the present embodiment. Then, the trimming code generating circuit 20 changes or holds the trimming code TC in accordance with the comparison result signal COMP. If the trimming code TC is changed, the trimming potential V2 varies again.

For example, the trimming code generating circuit 20 increases a value of the trimming code TC from an initial value in incremental steps. The trimming circuit 40 increases the trimming potential V2 in accordance with the increase in the value of the trimming code TC. Here, let us consider a case that the trimming potential V2 at the initial state is lower than the reference potential VREF. Also, when the reference potential VREF is higher than the trimming potential V2, the comparison result signal COMP is "Low (first signal)". On the other hand, when the reference potential VREF is lower than the trimming potential V2, the comparison result signal COMP becomes "High (second signal)".

When receiving the first signal (Low), the trimming code generating circuit 20 increases the trimming code TC. Accordingly, the trimming potential V2 is also increased. In other words, when receiving the first signal (Low), the trimming code generating circuit 20 changes the trimming code TC such that the trimming potential V2 is increased. Such an operation is repeated, and the trimming potential V2 increases gradually. When a certain trimming code TC is output, the trimming potential V2 become higher than the reference potential VREF. As a result, the comparison result signal COMP switches from the first signal (Low) to the second signal (High). When receiving the second signal (High), the trimming code generating circuit 20 does not change the trimming code TC but holds the trimming code TC as of then. The trimming code TC that is held is the optimum trimming code OTC corresponding to the desired potential V1.

Alternatively, the trimming code generating circuit 20 can decrease a value of the trimming code TC from an initial value in incremental steps. In this case, the trimming circuit 40 decreases the trimming potential V2 in accordance with the decrease in the value of the trimming code TC. Here, let us consider a case that the trimming potential V2 at the initial state is higher than the reference potential VREF. Also, when the reference potential VREF is smaller than the trimming potential V2, the comparison result signal COMP is "Low (first signal)". On the other hand, when the reference potential VREF is higher than the trimming potential V2, the comparison result signal COMP becomes "High (second signal)".

When receiving the first signal (Low), the trimming code generating circuit 20 decreases the trimming code TC. Accordingly, the trimming potential V2 is also decreased. In other words, when receiving the first signal (Low), the trimming code generating circuit 20 changes the trimming code TC such that the trimming potential V2 is decreased. Such an operation is repeated, and the trimming potential V2 decreases gradually. When a certain trimming code TC is output, the trimming potential V2 become lower than the reference potential VREF. As a result, the comparison result signal COMP switches from the first signal (Low) to the second signal (High). When receiving the second signal (High), the trimming code generating circuit 20 does not change the trimming code TC but holds the trimming code TC as of then. The trimming code TC that is held is the optimum trimming code OTC corresponding to the desired potential V1.

In this manner, the optimum trimming code OTC is determined inside an LSI in a self-sufficient manner. The trimming code generating circuit 20 changes the trimming code TC in order, while stops the change of the trimming code TC at the time when receiving the second signal from the comparator 50. Therefore, it is not necessarily that all kinds of trimming codes TC are generated. It is not necessary to generate trimming potentials V2 with regard to all kinds of trimming codes TC. As a result, electric power consumption at the time of the trimming is reduced. This is because the comparison result signal COMP is fed-back to the trimming code generating circuit 20.

Next, let us overview the normal operation mode. At the time of the normal operation, the switch 60 is turned OFF in order to prevent noises from inputting into the device through the pad 70 for use in voltage applying and monitoring. Therefore, the potential V1 at the first node N1 is the output potential of the charge pump 10. Also, the mode select signal MOD is set to "Low", and thereby the trimming code generating circuit 20 is set to operate in the normal operation mode. In this case, the trimming code generating circuit 20 outputs to the trimming circuit 40 the optimum trimming code OTC determined in the foregoing trimming operation. It would be enough that the optimum trimming code OTC is stored, for example, in a memory (not shown).

At the time of the normal operation mode, the trimming code TC is fixed to the optimum trimming code OTC. Thus, the trimming potential V2 output by the trimming circuit 40 varies in accordance with only the change in the potential V1 at the first node N1. The comparator 50 makes a comparison between the trimming potential V2 and the predetermined reference potential VREF, and outputs the comparison result signal COMP to the third node N3. The comparison result signal COMP is fed-back to the charge pump 10. Then, the charge pump 10 adjusts the potential V1 at the first node N1 such that the trimming potential V2 becomes substantially equal to the reference potential VREF. When the trimming potential V2 becomes equal to the reference potential VREF, the potential V1 at the first node N1 becomes the above-mentioned "desired potential". In this way, the charge pump 10 supplies the desirable internal potential to the first node N1.

1-2. Example of Detailed Circuit Configuration

Now, a specific configuration of each circuit for achieving the above-explained trimming operation and the normal operation will be described below. It should be noted that, in the following examples, the trimming code TC is a 4-bit binary code TC[3:0]. Also, if the reference potential VREF is higher than the trimming potential V2, the comparison result signal COMP is "Low (first signal)". On the other hand, if the reference potential VREF is lower than the trimming potential V2, the comparison result signal COMP is "High (second signal)".

(Charge Pump 10)

Figure 4:
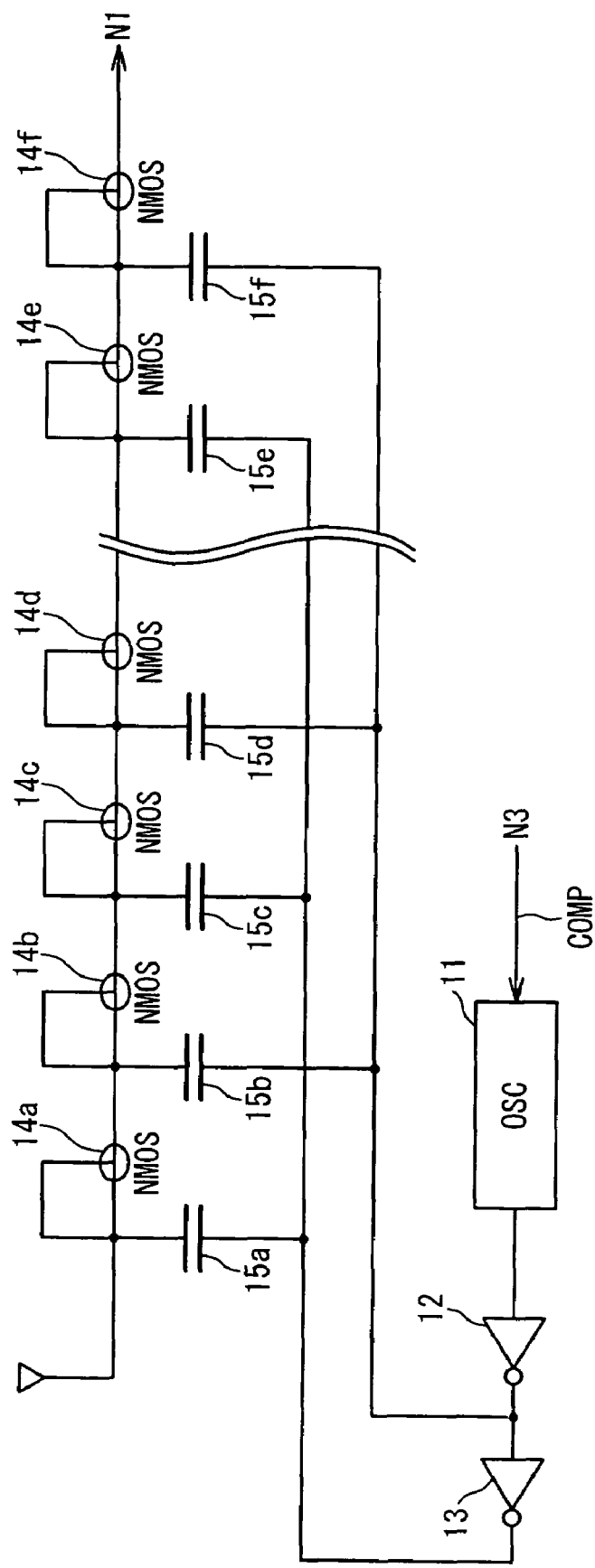
FIG. 4 is a circuit diagram showing a configuration of a charge pump according to the first embodiment of the present invention.

FIG. 4 shows a configuration example of the charge pump 10. The charge pump 10 has an oscillator 11, inverters 12, 13, a plurality of NMOS transistors 14a to 14f and a plurality of capacitors 15a to 15f. The NMOS transistors 14a to 14f are connected in series between a power-source and the first node N1. Gates of the NMOS transistors 14a to 14f are connected to the capacitors 15a to 15f, respectively. The capacitors 15b, 15d and 15f are connected to the output of the oscillator 11 through the inverter 12. The capacitors 15a, 15c and 15e are connected to the output of the oscillator 11 through the inverters 12 and 13.

In such a charge pump 10, a current flows from the side of the NMOS transistor 14a to the side of the NMOS transistor 14f with the oscillation of the oscillator 11. Thus, the potential V1 at the first node N1 is boosted. Here, the oscillator 11 is connected to the third node N3 and receives the comparison result signal COMP. If the comparison result signal COMP is "Low (first signal)", the oscillator 11 carries out the oscillation and thus the charge pump 10 carries out the boosting. On the other hand, if the comparison result signal COMP is "High (second signal)", the oscillator 11 stops the oscillation and thus the charge pump 10 stops the boosting.

(Trimming Code Generating Circuit 20)

As shown in FIG. 3, the trimming code generating circuit 20 according to the present embodiment has a counter 30 and a selector 21. The counter 30 carries out a count on the basis of a clock signal CLK, namely, the counter 30 counts the clock signals CLK and outputs a count value cout[3:0] to the selector 21. At the time of the trimming operation mode, the selector 21 outputs the count value cout[3:0] as the trimming code TC[3:0] to the trimming circuit 40. On the other hand, at the time of the normal operation mode, the selector 21 outputs the optimum trimming code OTC, which is stored in a predetermined storage region, to the trimming circuit 40. The switching between the modes is carried out by the mode select signal MOD.

Figure 5:
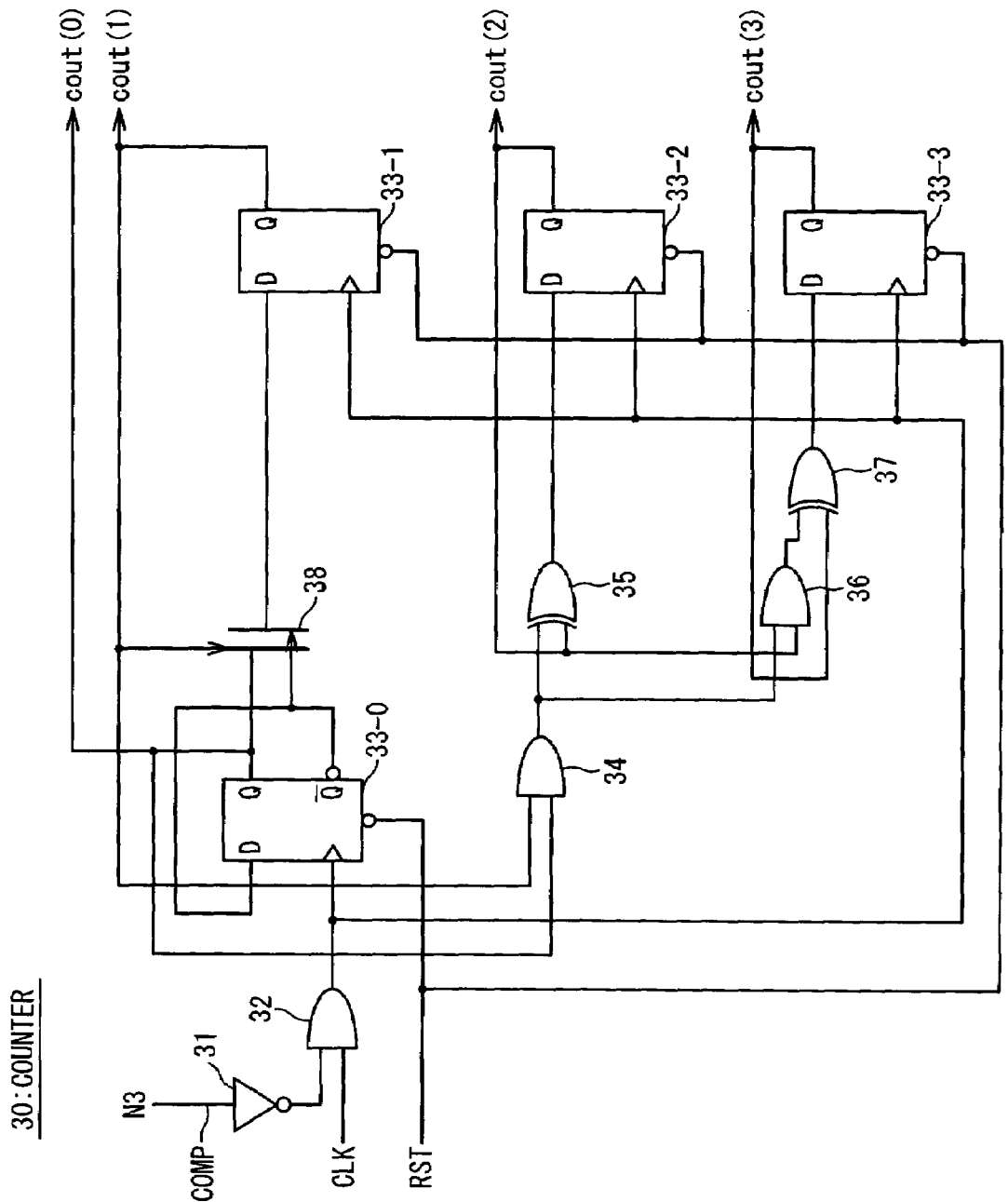
FIG. 5 is a circuit diagram showing a configuration of a counter according to the first embodiment of the present invention.

FIG. 5 shows a configuration example of the counter 30 according to the present embodiment. The counter 30 has an inverter 31, an AND 32, flip-flops 33-0 to 33-3, AND 34, 36, EXOR 35, 37 and a selector 38. The connection between the flip-flops 33-0 to 33-3, the AND 34, 36, the EXOR 35, 37 and the selector 38 is similar to that in a general counter and is well known in the art. Outputs Q of the flip-flops 33-0 to 33-3 correspond to respective of the count values cout[0] to cout [3].

A reset signal RST is input to a reset terminal of each flip-flop 33. In response to the reset signal RST, the output Q of each flip-flop 33 is set to "0". Thus, the count value cout [3:0] is reset to "0000". Also, the clock signal CLK is input through the AND 32 to a clock input terminal of each flip-flop 33. In synchronization with the clock signal CLK, each flip-flop 33 carries out a latch operation. Thus, the counter 30 carries out the count, and the count value cout[3:0] is increased one by one in synchronization with the clock signal CLK. That is to say, the trimming code TC[3:0] increases one by one in synchronization with the clock signal CLK. For example, when the clock signal CLK is input four times, the trimming code TC[3:0] is "0100".

In the present embodiment, an input of the inverter 31 is connected to the third node N3, and its output is connected to one of the inputs of the AND 32. Consequently, an inversion signal of the comparison result signal COMP is input to the one input of the AND 32. When the comparison result signal COMP is "Low (first signal)", the clock signal CLK is transferred to each flip-flop 33. Accordingly, the counter 30 carries out the count. That is, the trimming code generating circuit 20 changes the trimming code TC[3:0] based on the clock signal CLK. On the other hand, when the comparison result signal COMP is "High (second signal)", the clock signal CLK is masked by the AND 32. That is to say, even if the clock signal CLK is changed, the change is not input to the flip-flop 33. As a result, the counter 30 stops the counting operation. In other words, the counter 30 is deactivated in response to the second signal and thus the trimming code generating circuit 20 stops changing the trimming code TC.

(Trimming Circuit 40)

As shown in FIG. 3, the trimming circuit 40 has a resistance potential divider 44 and a trimming decoder 45. The trimming decoder 45 receives the trimming code TC[3:0] from the trimming code generating circuit 20. Then, the trimming decoder 45 decodes the trimming code TC[3:0] to generate a 16-bit decoded signal dout[15:0]. The decoded signal dout [15:0] determines the division ratio of the resistance potential divider 44.

Figure 6:
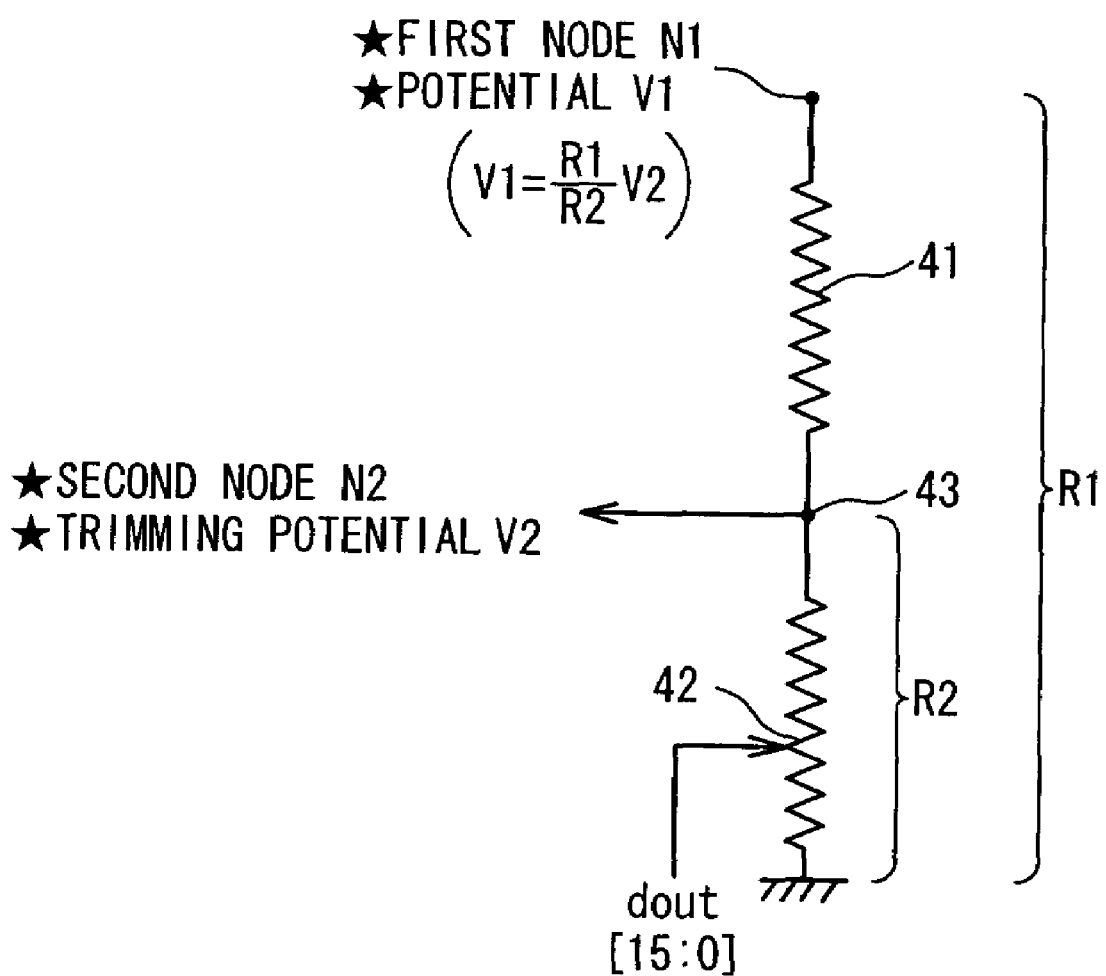
FIG. 6 is a circuit diagram showing a configuration of a resistance potential divider according to the first embodiment of the present invention.

FIG. 6 shows the resistance potential divider 44. The resistance potential divider 44 has a fixed resistance 41 and a variable resistance 42. The fixed resistance 41 is connected between the first node N1 and an intermediate node 43. The variable resistance 42 is connected between the intermediate node 43 and the ground. The intermediate node 43 is connected to the second node N2, and a potential at the intermediate node 43 is output as the trimming potential V2. By using the potential V1 at the first node N1, a total resistance value R1 of the resistance potential divider 44 and a resistance value R2 of the variable resistance 42, the potential V2 at the intermediate node 43 is represented by the following equation (1):

$$V2=(R2/R1)\times V1=\alpha V1 \quad (1)$$

By transforming the equation (1), the following equation (2) is obtained:

$$V1=(R1/R2)\times V2=\beta V2 \quad (2)$$

In the equation (1), the coefficient $\alpha$ is referred to as the division ratio. In the equation (2), the coefficient $\beta$ is referred to as a magnification ratio. In the present embodiment, the resistance value R2 of the variable resistance 42 is changed in accordance with the decoded signal dout[15:0]. Therefore, the division ratio $\alpha$ and the magnification ratio $\beta$ also change in accordance with the decoded signal dout[15:0].

Figure 7:
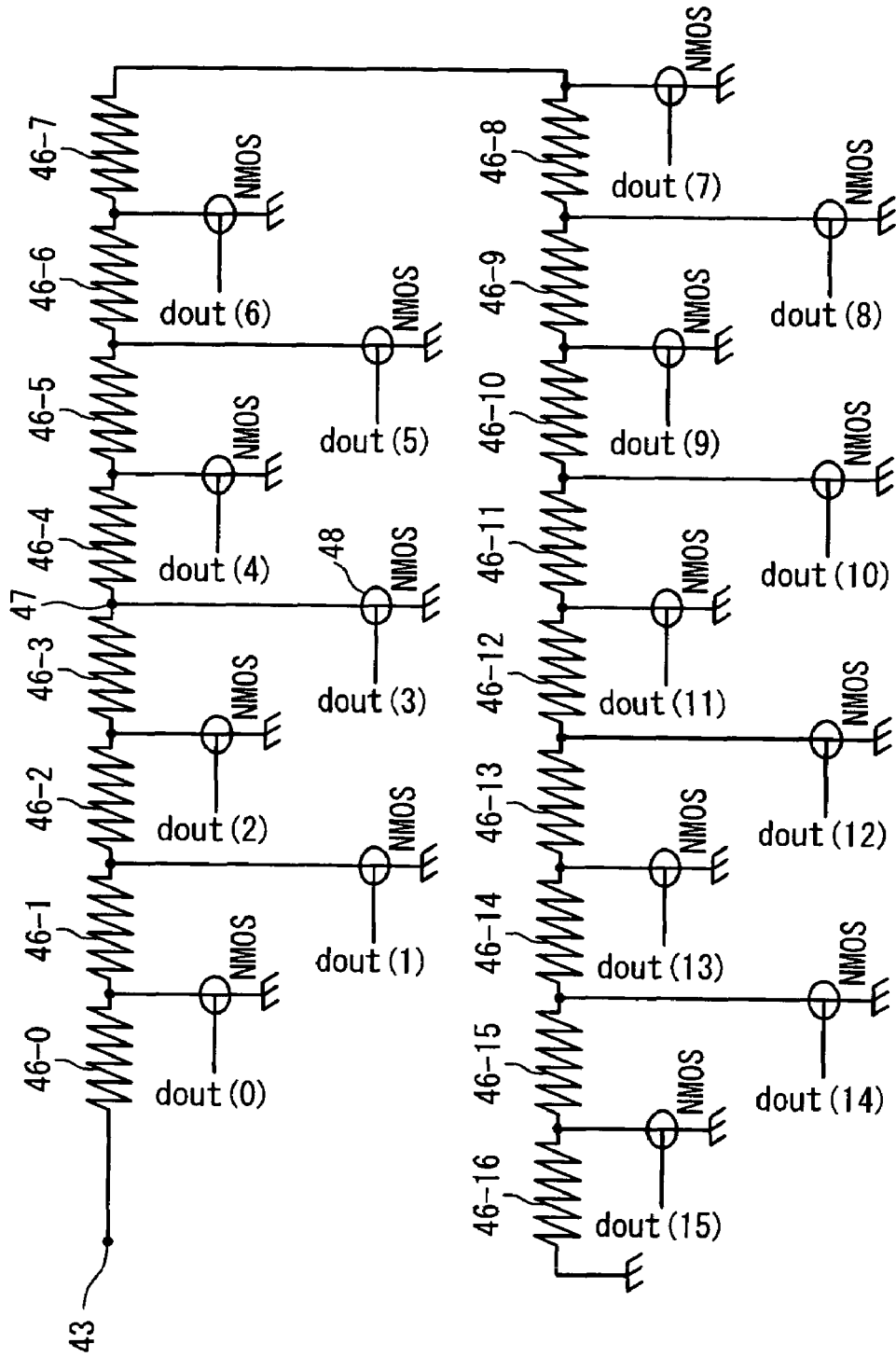
FIG. 7 is a circuit diagram showing a variable resistance according to the first embodiment of the present invention.

FIG. 7 shows a configuration example of the variable resistance 42. The variable resistance 42 has resistances 46-0 to 46-16 that are connected in series. The resistance 46-0 is connected to the intermediate node 43, and the resistance 46-16 is connected to the ground. Further, a plurality of NMOS transistors are provided between the ground and respective of a plurality of nodes between the resistances. For example, a node 47 between the resistance 46-3 and the resistance 46-4 is connected through the NMOS 48 to the ground. Respective bits of the 16-bit decoded signal dout[15:0] are applied to respective gates of the plurality of NMOS transistors. For example, if the trimming code TC[3:0] is "0011", only the decoded signal dout[3] is "High". In this case, the NMOS 48 is turned ON, and the node 47 is connected to the ground. As the value of the trimming code TC[3:0] becomes larger, the resistance value R2 and the division ratio $\alpha$ become larger, while the magnification ratio $\beta$ becomes smaller.

In this way, the division ratio $\alpha$ and the magnification ratio $\beta$ change in accordance with the trimming code TC[3:0]. As can be clearly seen from the equation (1), the trimming potential V2 depends on the trimming code TC and the potential V1 at the first node N1. Moreover, since the total resistance value R1 is larger than the resistance value R2, the division ratio $\alpha$ is smaller than 1. Therefore, the trimming potential V2 changes between the potential V1 and the ground potential GND in accordance with the trimming code TC.

At the time of the trimming operation, the potential V1 is fixed. Then, the division ratio $\alpha$ and the magnification ratio $\beta$ are adjusted by the trimming code generating circuit 20 such that the potential V2 at the intermediate node 43 becomes equal to the reference potential VREF. As a result, an optimum trimming code OTC is determined. On the other hand, at the time of the normal operation, the optimum trimming code OTC is given and hence the division ratio $\alpha$ and the magnification ratio $\beta$ are fixed. Then, the potential V1 of the first node N1 is adjusted by the charge pump 10 such that the potential V2 at the intermediate node 43 becomes equal to the reference potential VREF. As a result, the charge pump 10 outputs the internal potential V1 corresponding to the optimum trimming code OTC.

1-3. Trimming Operation Mode

Figure 8:
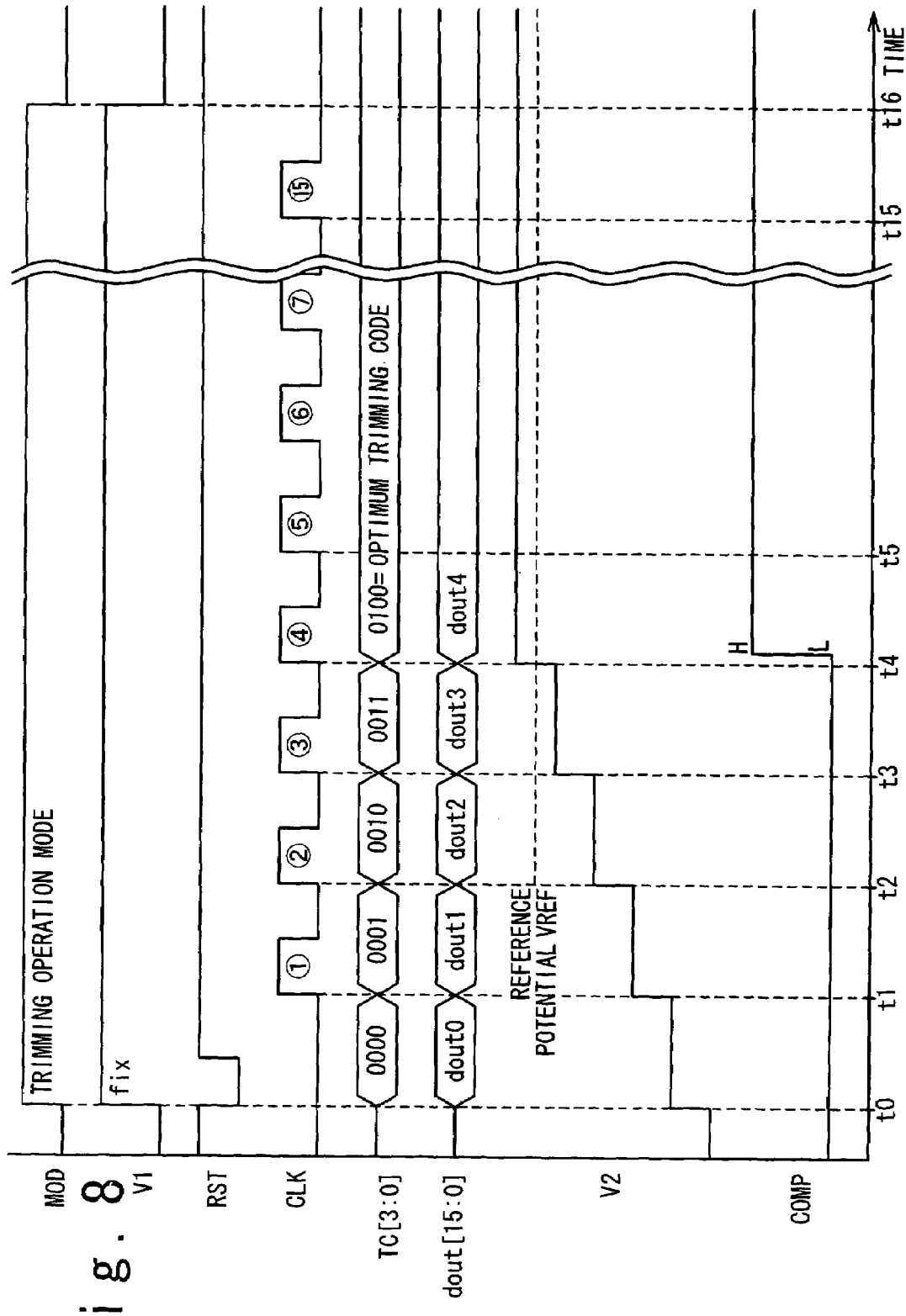
FIG. 8 is a timing chart showing a trimming operation according to the first embodiment of the present invention.

FIG. 8 is a timing chart showing a trimming operation according to the present embodiment. Shown in FIG. 8 are the mode select signal MOD, the first node potential V1, the reset signal RST, the clock signal CLK, the trimming code TC[3:0], the decoded signal dout[15:0], the trimming potential V2 and the comparison result signal COMP.

At a time t0, the mode select signal MOD becomes "High". Accordingly, the trimming code generating circuit 20 is set to operate in the trimming operation mode. At the time of the trimming, the first node potential V1 is fixed to a desired potential. Also, the reset signal RST is input in synchronization with the mode select signal MOD.

Accordingly, the counter 30 is reset, and the trimming code TC is set to "0000". The decoded signal dout[0] becomes "High", and the resistance value R2 of the variable resistance 42 takes a minimum value (see FIG. 7). The division ratio $\alpha$ also takes a minimum value. The trimming potential V2 determined by the division ratio $\alpha$ and the first node potential V1 is output to the second node N2. At that time, the trimming potential V2 is lower than the reference potential VREF. Therefore, the comparison result signal COMP is "Low (first signal)".

At a time t1, the first clock signal CLK is input. Since the comparison result signal COMP is "Low", the counter 30 carries out the count and the trimming code TC is set to "0001". As a result, the decoded signal dout[1] becomes "High", and the resistance value R2 and the division ratio α are increased. Although the trimming potential V2 is also increased, it is still lower than the reference potential VREF. Therefore, the comparison result signal COMP is still kept "Low".

Similarly, the clock signals CLK are input at times t2 and t3. The trimming code TC is increased and the trimming potential V2 is also increased. Then, as a result of the count at a time t4, the trimming potential V2 becomes higher than the reference potential VREF. Thus, the comparison result signal COMP is switched to "High (second signal)". The trimming code TC at this time is "0100".

At a time t5, the fifth clock signal CLK is input. However, the counter 30 does not carry out the count, because the comparison result signal COMP is still "High". Thus, the trimming code TC is still "0100". After that, even if the clock signal CLK is input, the trimming code TC does not change.

In the present example, the trimming code TC[3:0] can represent 16 kinds of values (0000 to 1111). In this case, the switching of the trimming codes TC can be carried out up to 15 times. Therefore, it is only necessary to input the clock signal CLK for the trimming 15 times. At a time t15, the fifteenth clock signal is input. Then, at a time t16, the mode select signal MOD is set to "Low". Accordingly, the trimming operation mode of the trimming code generating circuit 20 is completed. The count value "0100" held by the counter 30 at the time t16 is the optimum trimming code OTC.

Figure 9:
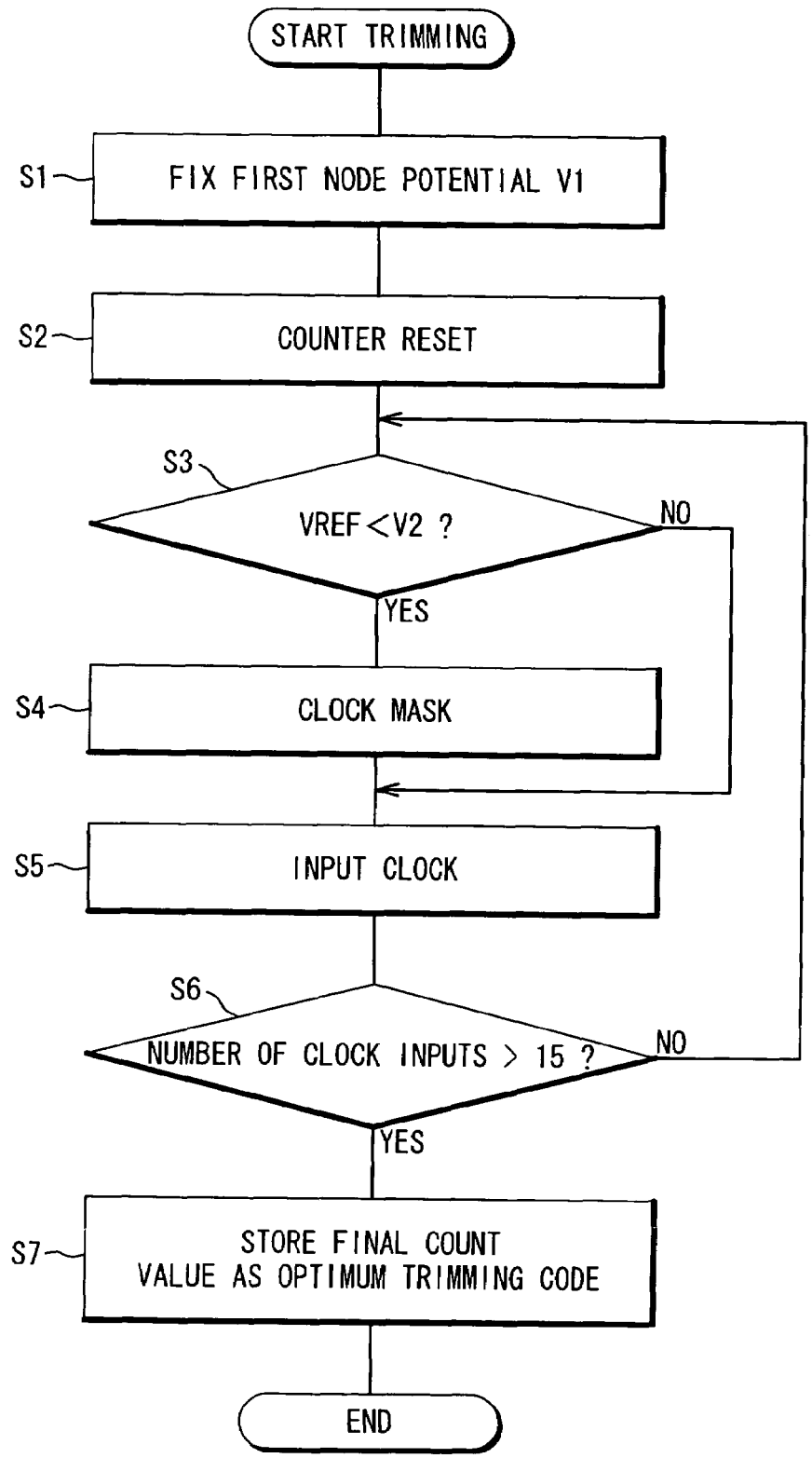
FIG. 9 is a flowchart showing a trimming operation according to the first embodiment of the present invention.

FIG. 9 is a flowchart briefly showing the trimming according to the present embodiment. At the time of the trimming, the potential V1 at the first node N1 is fixed to a desired potential by using the pad 70 for use in voltage applying and monitoring (Step S1). Next, the reset signal RST is input and hence the counter 30 is reset (Step S2). If the reference potential VREF is higher than the trimming potential V2 (Step S3; No), the clock signal CLK is not masked, and the counter 30 carries out the count in response to the clock input (Step S5). If the trimming potential V2 becomes higher than the reference potential VREF (Step S3; Yes), the clock signal CLK is masked, and the counter 30 is deactivated (Step S4). After that, even if the clock is input (Step S5), the counting is not executed. If the number of the clock inputs becomes larger than 15 (Step S6, Yes), the trimming operation is completed. The final count value finally counted by the counter 30 is the optimum trimming code OTC (Step S7). The optimum trimming code OTC is stored in a storage region such as a memory and the like.

In the trimming according to the present embodiment, as described above, it is possible to determine an optimum trimming code OTC in the self-sufficient manner in the course of sequentially changing the trimming code TC. After the optimum trimming code OTC is determined, the trimming code TC is not changed (see FIG. 8). That is, the trimming code generating circuit 20 not necessarily generate all kinds of the trimming codes TC. After the optimum trimming code OTC is determined, the counter 30 is deactivated and thus the electric power consumption is reduced. Moreover, after the determination of the optimum trimming code OTC, the trimming potential V2 is not changed, which can reduce the electric power consumptions of the trimming circuit 40 and the comparator 50. Such operations can be attained by feeding the comparison result signal COMP from the comparator 50 back to the counter 30. Thus, the effects according to the present embodiment can be obtained with a simpler circuit configuration than in the conventional technique.

1-4. Normal Operation Mode

Figure 10:
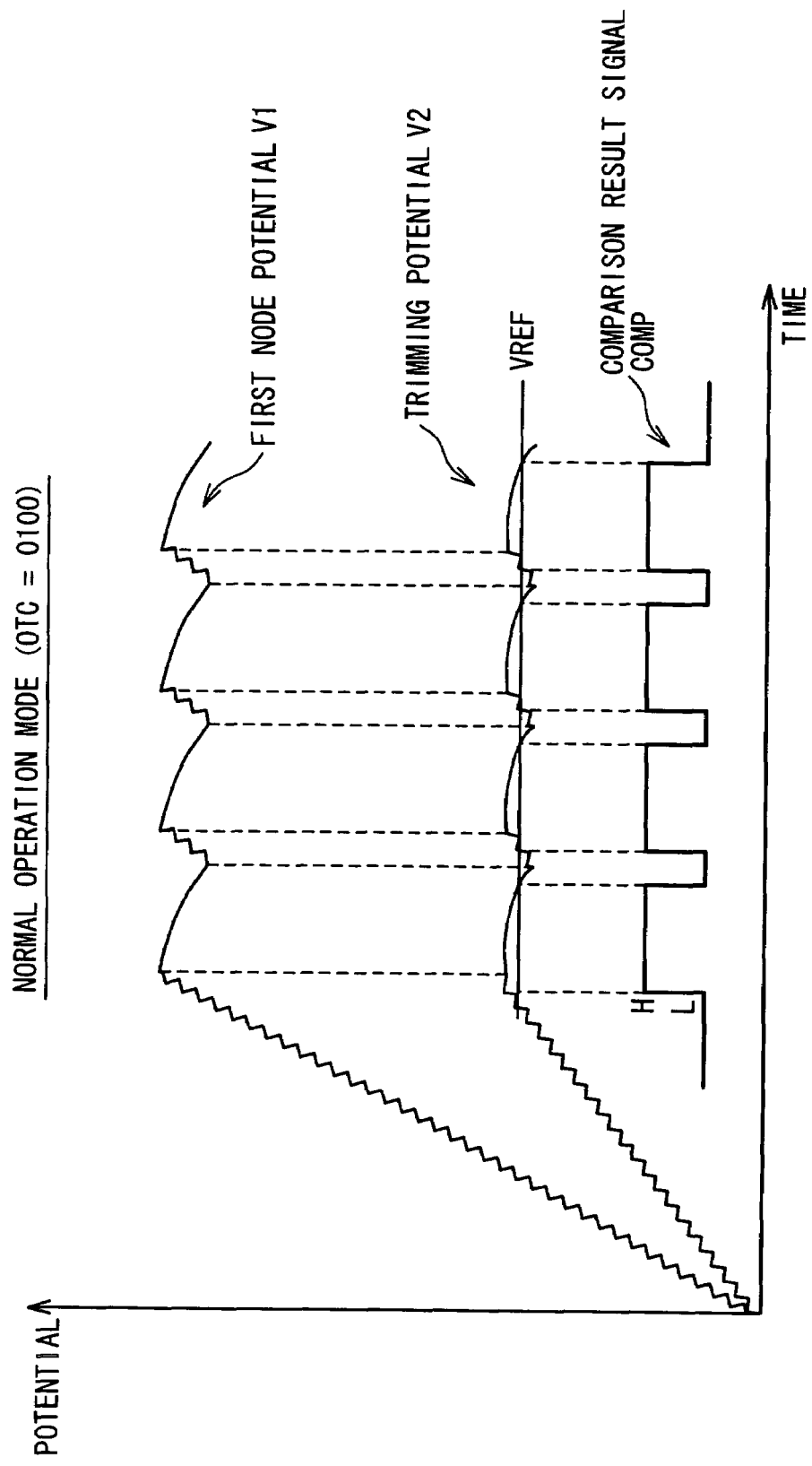
FIG. 10 is a graph showing a normal operation according to the first embodiment of the present invention.

FIG. 10 is a graph showing the normal operation according to the present embodiment. Shown in FIG. 10 are the potential V1 at the first node N1, the potential (trimming potential) V2 at the second node and the potential (comparison result signal COMP) at the third node N3. In the case of the normal operation mode, the trimming code generating circuit 20 outputs the optimum trimming code OTC ("0100") to the trimming circuit 40. The trimming circuit 40 outputs the trimming potential V2 which is determined by the optimum trimming code OTC and the potential V1.

At first, the potential V1 at the first node N1 is substantially at the ground level, and the trimming potential V2 is lower than the reference potential VREF. Accordingly, the comparison result signal COMP is "Low (first signal)". In the case, the oscillator 11 of the charge pump 10 carries out the oscillation, and the charge pump 10 carries out the boosting. As a result, the potential V1 at the first node N1 gradually increases and hence the trimming potential V2 gradually increases. At a certain timing, the trimming potential V2 becomes higher than the reference potential VREF, and thereby the comparison result signal COMP changes from "Low (first signal)" to "High (second signal)". When receiving the second signal, the oscillator 11 stops the oscillation, and hence the charge pump 10 stops the boosting. At this time, the potential V1 at the first node N1 is substantially equal to the desired internal potential.

After that, the potential V1 at the first node N1 gradually decreases due to discharging through the resistance potential divider 44. In association with that, the trimming potential V2 is also decreased gradually. At a certain timing, the trimming potential V2 becomes lower than the reference potential VREF again, and the comparison result signal COMP changes to "Low" again. As a result, the charge pump 10 starts the boosting again. After that, the same operations are repeated. In this way, the output potential of the charge pump 10 is kept close to the desired internal potential.

It should be noted that, when the charge pump 10 is broken, the desired internal potential is not supplied to the first node N1. At the time of the trimming operation, the potential V1 at the first node N1 is fixed externally. Therefore, even if the charge pump 10 is broken, a certain optimum trimming code OTC is determined. In order to detect whether or not the charge pump 10 is broken, it is preferable that the potential V1 at the first node N1 is measured after the trimming is completed. In order to measure the potential V1, the above-mentioned pad 70 for use in voltage applying and monitoring can be used. More specifically, the switch 60 is turned ON by the switch open/close signal switch SW, and the tester detects the potential V1 at the first node N1 through the pad 70 for use in voltage applying and monitoring.

It should be noted that the above-mentioned trimming code generating circuit 20, the trimming circuit 40 and the comparator 50 constitute a "power-source potential control circuit" that can control the power-source potential output from the charge pump 10. An input terminal of the power-source potential control circuit corresponds to the first node N1, and its output terminal corresponds to the third node N3. The power-source potential control circuit receives through the input terminal the output potential output by the charge pump 10. The comparison result signal COMP output to the charge pump 10 through the output terminal serves as an "output potential control signal" for controlling the output potential of the charge pump 10. It can be also said that the trimming code generating circuit 20, the trimming circuit 40 and the comparator 50 serves as a power-source potential control unit that can provide the following functions: (1) generating the trimming potential V2 on the basis of the trimming code TC and the output potential of the charge pump 10 (the potential V1 at the first node N1); (2) comparing between the generated trimming potential V2 and the predetermined reference potential VREF; (3) outputting the output potential control signal (comparison result signal COMP) in accordance with the result of the comparison; and (4) changing and adjusting the trimming potential V2 in accordance with the result of the comparison.

A power-source generating device to which such the power-source potential control circuit is applied is not limited to the charge pump 10 exemplified above. The power-source potential control circuit according to the present invention can be applied to any power-source generating device that outputs the power-source potential in accordance with the output potential control signal. For example, a regulator such as a band gap regulator (BGR) and the like is another example of the power-source generating device.

2. Second Embodiment

Figure 11:
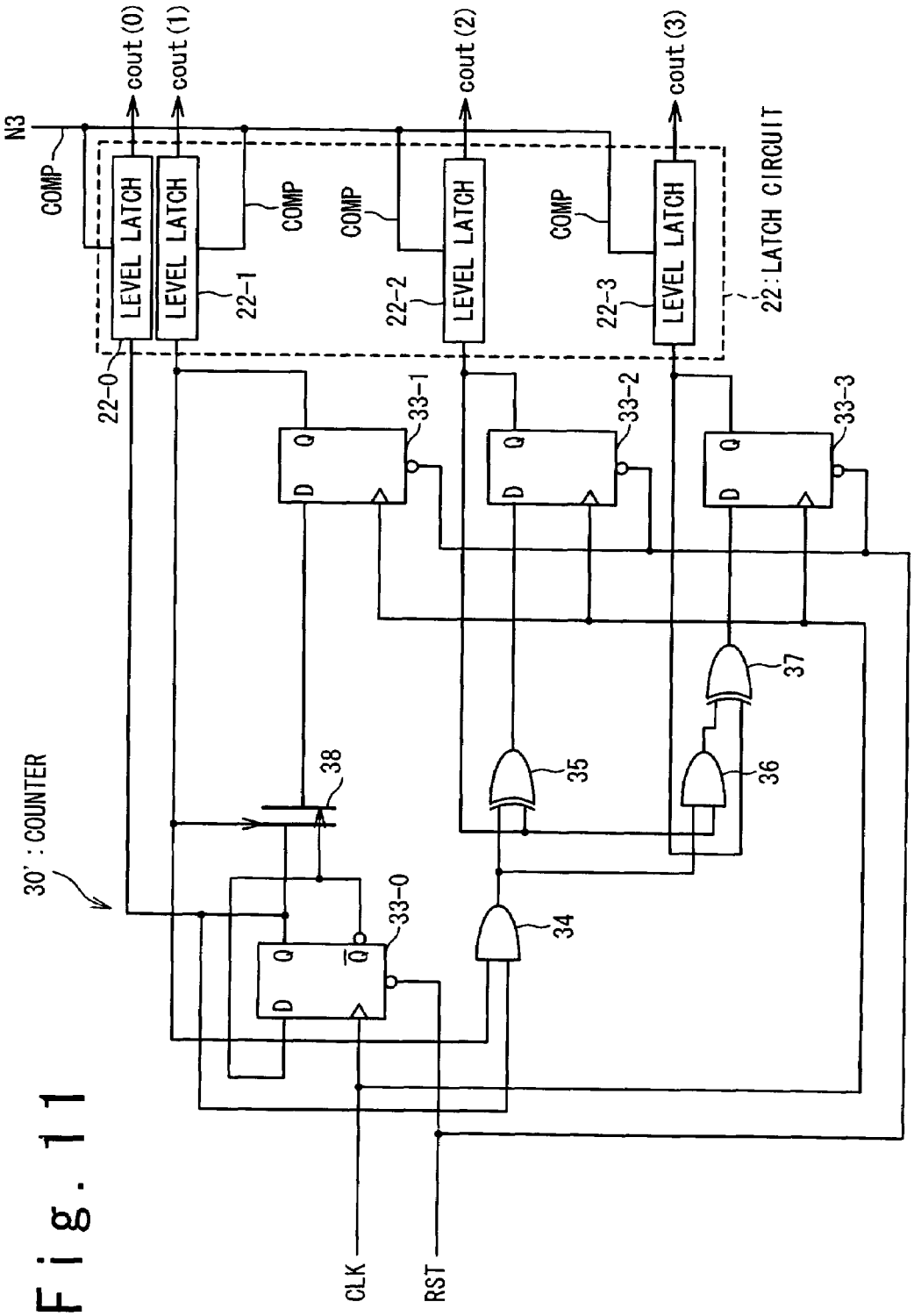
FIG. 11 is a circuit block diagram showing a configuration of a trimming code generating circuit according to a second embodiment of the present invention.

The configuration of the trimming code generating circuit 20 is not limited to that in the first embodiment. FIG. 11 is a circuit block diagram showing a configuration of the trimming code generating circuit 20 according to the second embodiment. In FIG. 11, the same reference numerals are given to the same components as those described in the first embodiment, and redundant explanations will be properly omitted.

According to the present embodiment, the trimming code generating circuit 20 has a counter 30' and a latch circuit 22. The latch circuit 22 is provided at the later stage of the counter 30'. More specifically, the latch circuit 22 includes level latches 22-0 to 22-3 for latching respective of the count values cout[0] to cout[3]. Respective of the level latches 22-0 to 22-3 are provided between respective outputs of the flip-flops 33-0 to 33-3 and the selector 21. In the present embodiment, these level latches 22-0 to 22-3 are connected to the third node N3 and receive the comparison result signal COMP from the comparator 50. The comparison result signal COMP serves as a control signal for controlling the latching operation.

At the time of the trimming, the reset signal RST is input to the reset terminal of each flip-flop 33. Accordingly, the count value cout[3:0] is reset to "0000". Also, the clock signal CLK is input to the clock input terminal of each flip-flop 33. In synchronization with the clock signal CLK, the counter 30 carries out the count. The count value cout[3:0] is output as the trimming code TC[3:0] to the latch circuit 22.

The latch circuit 22 transfers the trimming code TC[3:0] as long as receiving the first signal (Low) as the comparison result signal COMP. In this case, the trimming code generating circuit 20 increases the trimming code TC[3:0] one by one in synchronization with the clock signal CLK. On the other hand, when receiving the second signal (High) as the comparison result signal COMP, the latch circuit 22 latches the trimming code TC[3:0]. In other words, the latch circuit 22 latches the trimming code TC[3:0] in response to the second signal. Consequently, the trimming code TC[3:0] output from the trimming code generating circuit 20 is fixed to the value at the time of the latching. Even if the counting by the counter 30' proceeds, the trimming code TC[3:0] does not change.

Figure 12:
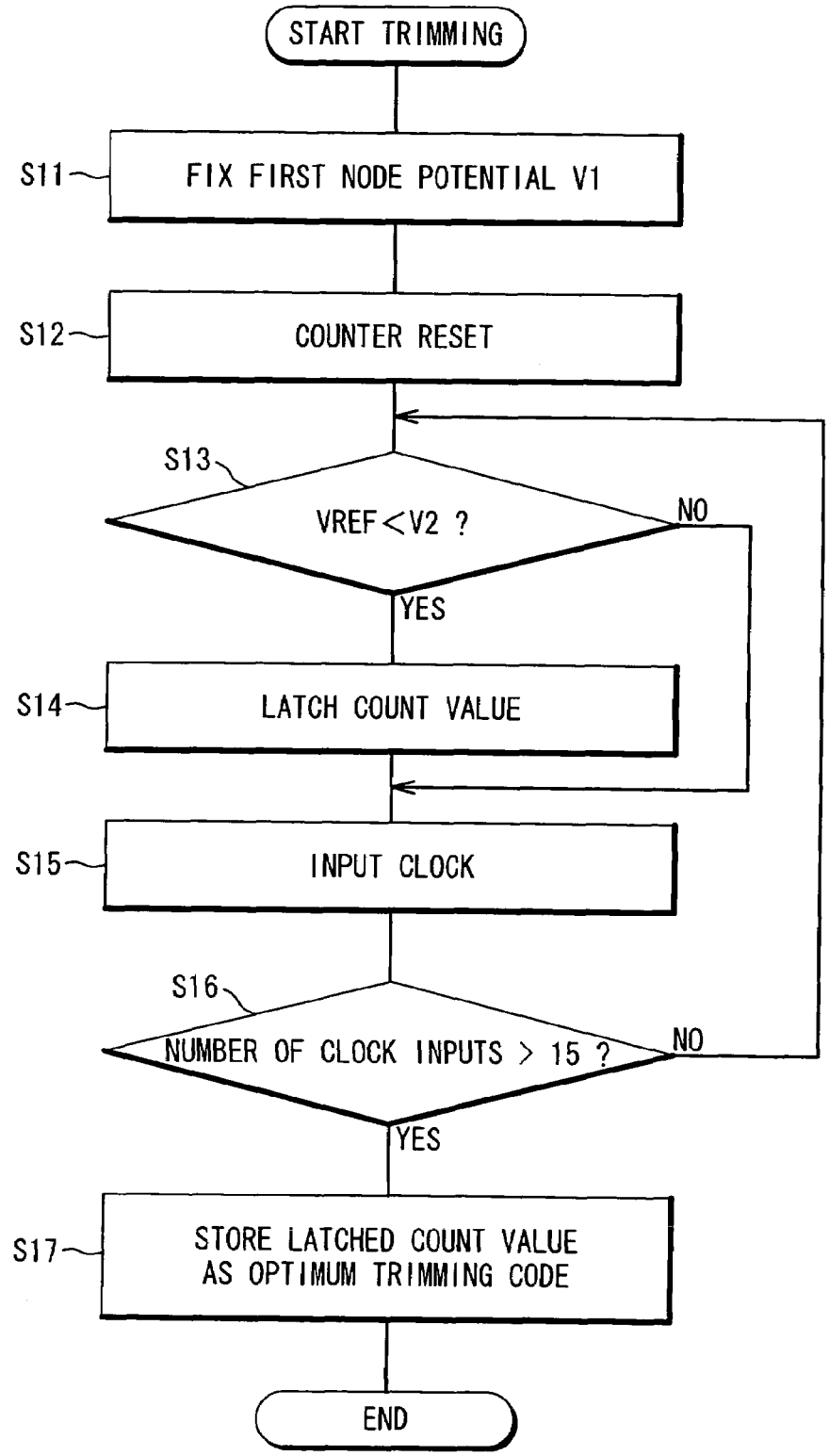
FIG. 12 is a flowchart showing a trimming operation according to the second embodiment of the present invention.

FIG. 12 is a flowchart briefly showing the trimming operation according to the present embodiment. At the time of the trimming, the potential V1 at the first node N1 is fixed to the desired value by using the pad 70 for use in voltage applying and monitoring (Step S11). Next, the reset signal RST is input, and hence the counter 30' is reset (Step S12). If the reference potential VREF is higher than the trimming potential V2 (Step S13; No), the trimming code TC is increased in response to the clock input (Step S15). If the trimming potential V2 becomes higher than the reference potential VREF (Step S13; Yes), the latch circuit 22 latches the current count value (Step S14). After that, the count is masked, and the trimming code TC does not change even if the clock is input. If the number of the clock inputs exceeds 15 (Step S16; Yes), the trimming operation is completed. The count value latched by the latch circuit 22 is the optimum trimming code OTC (Step S17). The effects as in the first embodiment can be also obtained by using the configuration according to the present embodiment.

3. Third Embodiment

Figure 13:
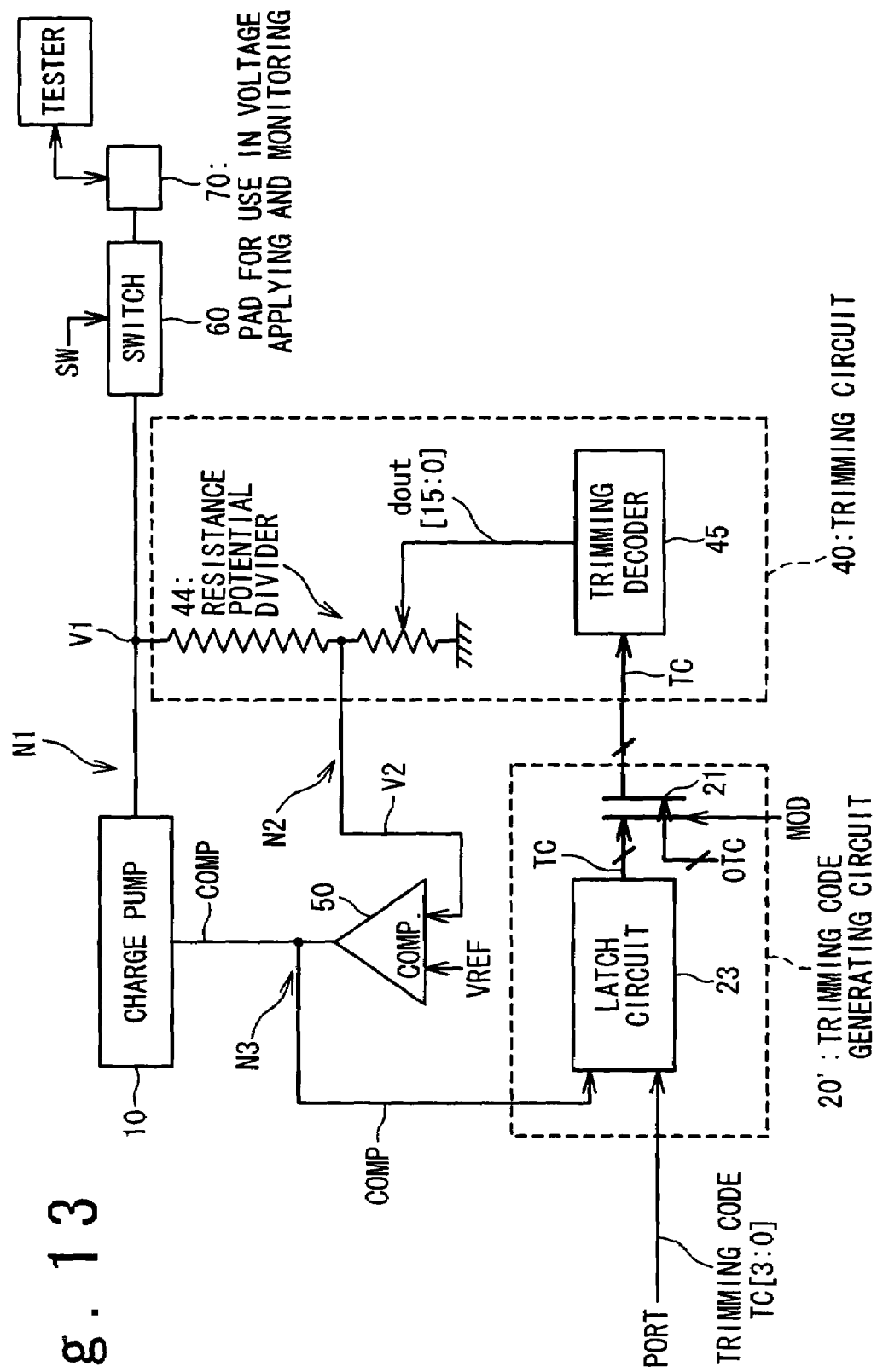
FIG. 13 is a block diagram showing a configuration of a semiconductor integrated circuit device according to a third embodiment of the present invention.

FIG. 13 shows a configuration of a semiconductor integrated circuit device according to a third embodiment. In FIG. 13, the same reference numerals are given to the same components as those described in the first embodiment, and redundant explanations will be properly omitted. A trimming code generating circuit 20' according to the present embodiment has a latch circuit 23 instead of the counter 30. The comparison result signal COMP output from the comparator 50 is input to the latch circuit 23 as a control signal for controlling the latch operation. Moreover, the trimming codes TC[3:0] are sequentially supplied from a tester to the latch circuit 23 through a port. The supplied trimming code TC[3:0] changes in time.

The latch circuit 23 transfers the trimming code TC[3:0] as long as receiving the first signal (Low) as the comparison result signal COMP. In this case, the trimming code TC[3:0] is changed in order. On the other hand, when receiving the second signal (High) as the comparison result signal COMP, the latch circuit 23 latches the trimming code TC[3:0]. In other words, the latch circuit 23 latches the trimming code TC[3:0] in response to the second signal. Consequently, the trimming code TC[3:0] output from the trimming code generating circuit 20' is fixed to the value at the time of the latching. The effects as in the first embodiment can be also obtained by using the configuration according to the present embodiment.

4. Fourth Embodiment

Figure 14:
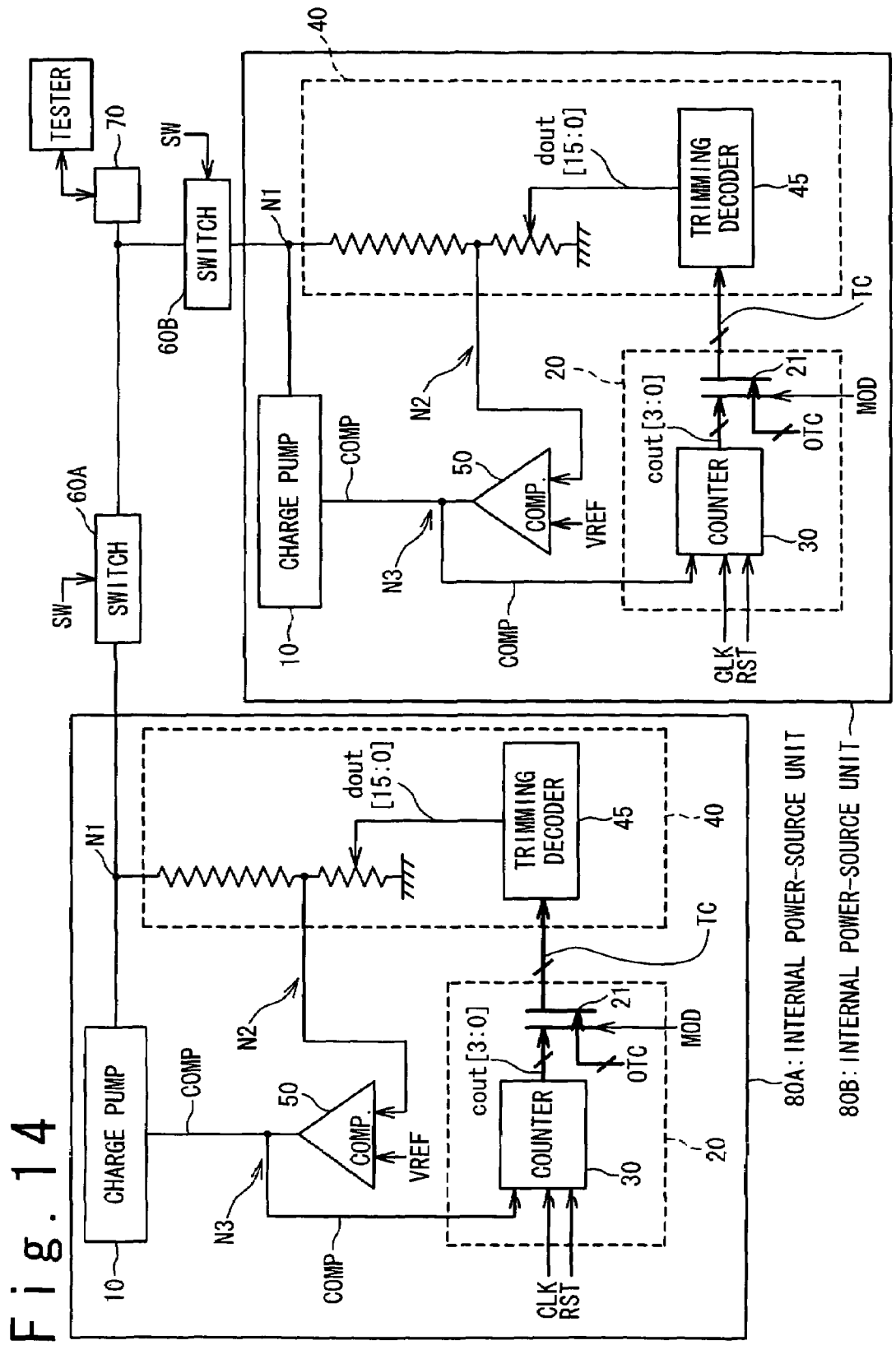
FIG. 14 is a block diagram showing a configuration of a semiconductor integrated circuit device according to a fourth embodiment of the present invention.

The present invention is useful even in a case where a semiconductor chip is provided with a plurality of charge pumps 10. FIG. 14 shows a configuration of a semiconductor integrated circuit device according to a fourth embodiment. As shown in FIG. 14, one charge pump 10 and a circuit group for performing the trimming with respect to the one charge pump 10 are collectively referred to as an "internal power-source unit 80". The semiconductor integrated circuit device according to the present embodiment is provided with a plurality of internal power-source units 80. In FIG. 14, each of the internal power-source units 80 includes the same circuit group as in the first embodiment. The same reference numerals are given to the same components as those described in the first embodiment, and redundant explanations will be properly omitted. It should be noted that each internal power-source unit 80 can include the circuit group as in the second or the third embodiment.

In FIG. 14, the first node N1 of an internal power-source unit 80A is connected through a switch 60A to the pad 70 for use in voltage applying and monitoring. Similarly, the first node N1 of an internal power-source unit 80B is connected through a switch 60B to the pad 70 for use in voltage applying and monitoring. That is to say, the first nodes N1 of the plurality of internal power-source units 80 are connected to one pad 70 for use in voltage applying and monitoring.

Even though the plurality of internal power-source units 80 are included in the same semiconductor chip, there is a possibility that the potential V1 at the first node N1 varies between the internal power-source units 80. One of the causes is the manufacturing variability of the resistance potential divider in the trimming circuit 40. Furthermore, there is a possibility that the reference potential VREF varies between the internal power-source units 80 due to the manufacturing variability. Since the potential V1 at the first node N1 is β (the magnification ratio) times the trimming potential V2, the variation of the reference potential VREF especially has an influence on the variation of the potential V1 at the first node N1, as compared with the other manufacturing variability. Thus, the trimming is necessary.

At the time of the trimming, the switches 60A and 60B are turned on by the switch open/close signal SW. In addition, by using a tester, a desired potential is applied to the pad 70 for use in voltage applying and monitoring. Accordingly, the potential V1 at the first node N1 in each internal power-source unit 80 is fixed to the desired potential. Then, the trimming operations are performed in respective of the internal power-source units 80, and thus the optimum trimming codes OTC for respective of the charge pumps 10 are determined.

According to the present embodiment, the effects as in the foregoing embodiment can be obtained. Moreover, an additional effect that the time required for the trimming is reduced can be obtained. This is because the trimming operations are executed collectively with respect to the plurality of internal power-source units 80.

Figure 1:
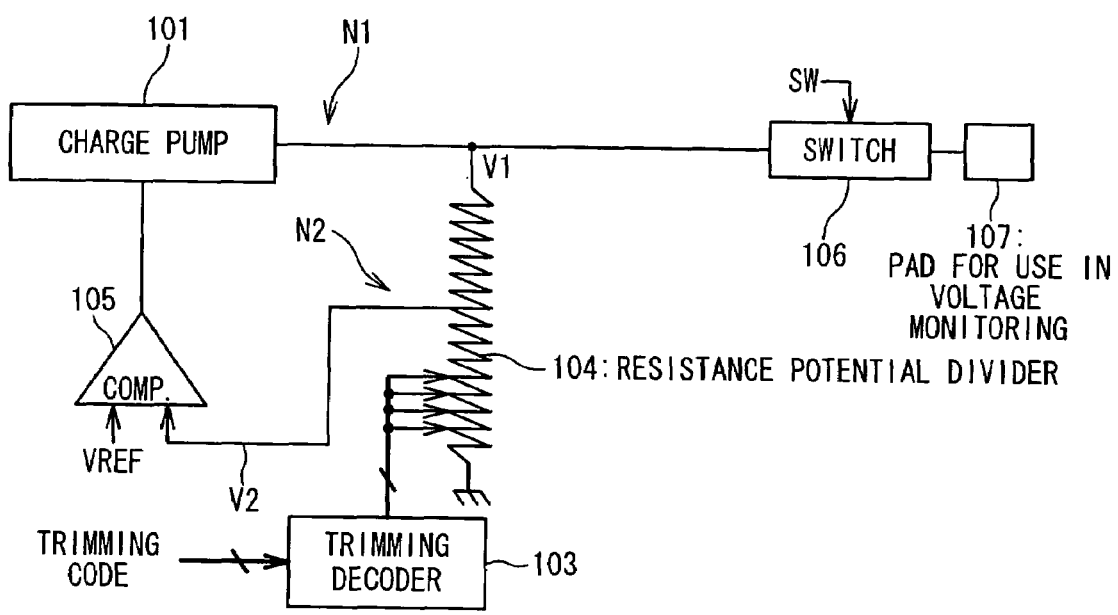
FIG. 1 is a block diagram showing a configuration of a conventional semiconductor integrated circuit device.
Figure 2:
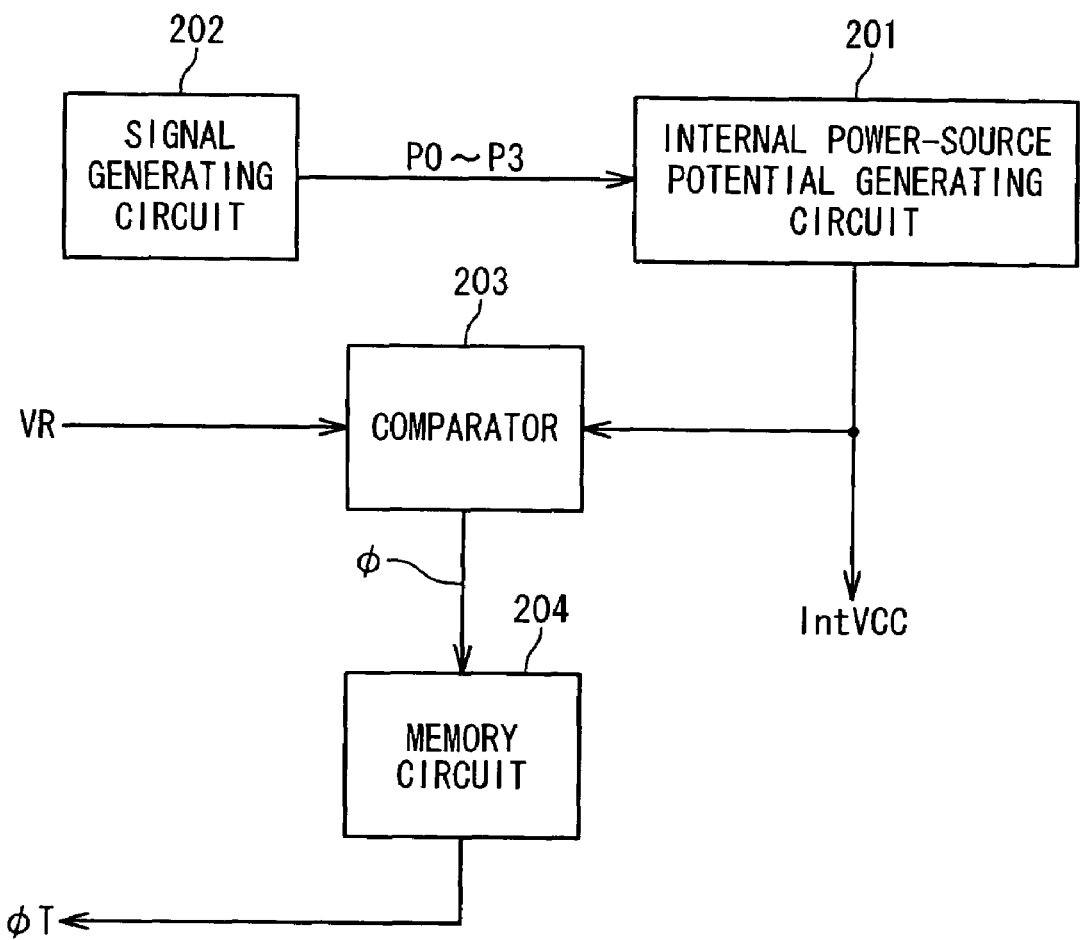
FIG. 2 is a block diagram showing a configuration of another conventional semiconductor integrated circuit device.

In the case of the conventional technique shown in FIG. 1, for example, it is necessary to execute the trimming operation while monitoring the potential V1 by using the pad 107 for use in voltage monitoring. It is therefore necessary to sequentially switch the trimming-target charge pump in the case where the semiconductor chip is provided with a plurality of charge pumps. A considerably long time is required for completing the trimming operations with respect to all the charge pumps. On the other hand, according to the present invention, the trimming of each internal power-source unit 80 is performed in a self-sufficient manner. Thus, it is not necessary to monitor the potential V1 at the first node N1 by using the pad 70. Instead, a desired potential is applied to the pad 70. Each internal power-source unit 80 is connected to the pad 70, and the potential V1 at the first node N1 in each internal power-source unit 80 is fixed to the desired potential. Consequently, the trimming operations are collectively performed with respect the plurality of internal power-source units 80. As a result, the time required for the trimming operations is reduced.

5. Fifth Embodiment

Figure 15:
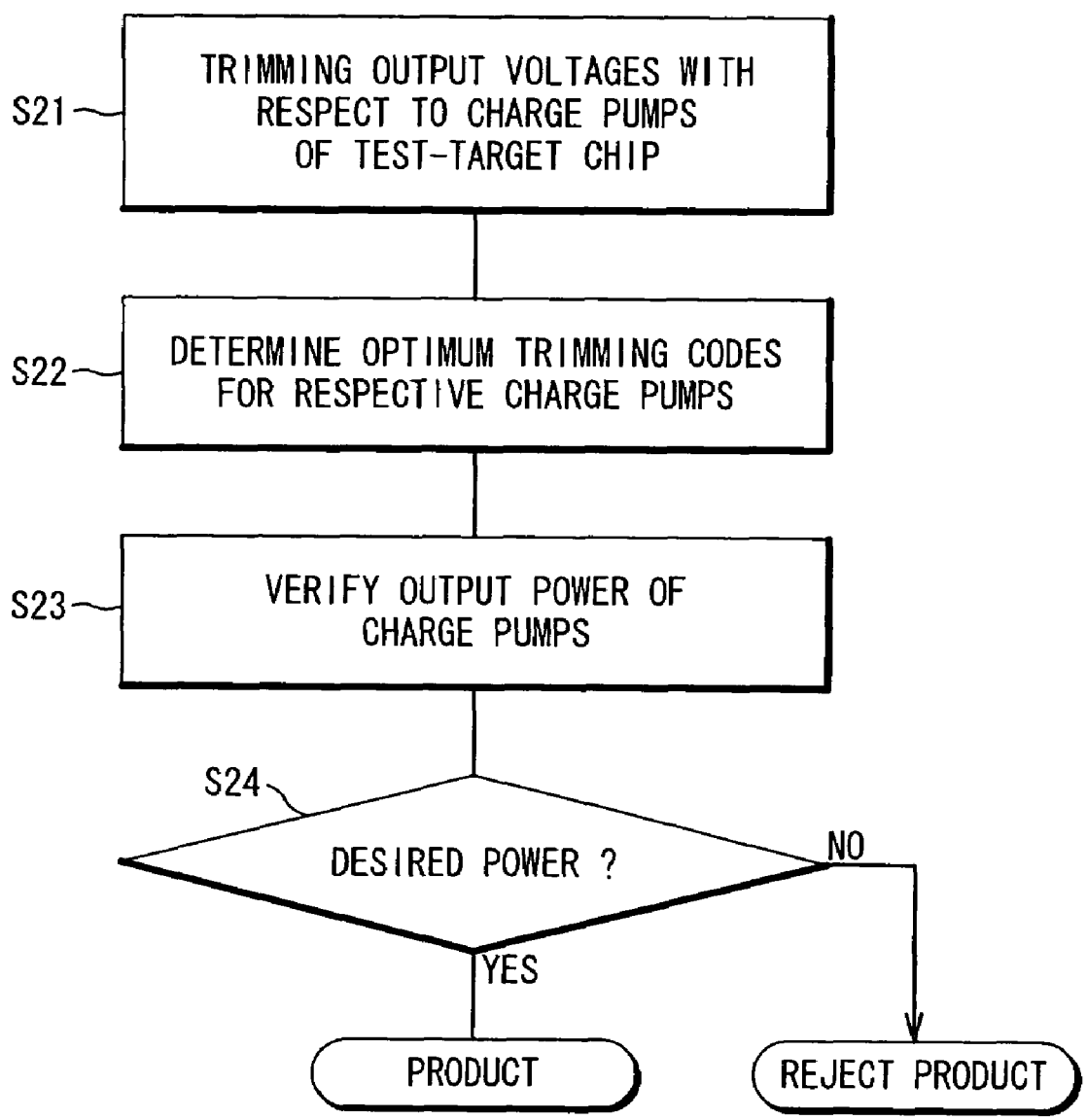
FIG. 15 is a flowchart showing a method of testing the semiconductor integrated circuit device according to the present invention.

In a fifth embodiment of the present invention, a semiconductor chip is also provided with the plurality of charge pumps 10. FIG. 15 is a flow-chart showing how such a semiconductor chip is completed as a product after it is manufactured.

First, the trimming operations are performed with respect to the plurality of charge pumps by using the method as in the fourth embodiment (Step S21). Accordingly, optimum trimming codes OTC for respective of the charge pumps 10 are determined (Step S22). Next, output powers (output performance) of respective charge pumps 10 are verified (Step S23). More specifically, it is verified whether or not the charge pump 10 supplies the internal potential corresponding to the optimum trimming code OTC. In short, whether or not the charge pump 10 operates normally is checked. If the desired output power is being obtained (Step S24; Yes), the semiconductor chip becomes a product. On the other hand, if there exists at least one charge pump 10 that does not output the desired internal potential (Step S24; No), the semiconductor chip is rejected as a defective product.

The fifth embodiment of the present invention provides a technique for reducing the period required for the above-mentioned Step S23.

FIG. 16 shows a configuration of s semiconductor integrated circuit device according to the fifth embodiment. In FIG. 16, the same reference numerals are given to the same components as those described in the fourth embodiment, and redundant explanations will be properly omitted. The semiconductor integrated circuit device is provided with the internal power-source units 80A, 80B and the pad 70 for use in voltage applying and monitoring. The first node N1 of the internal power-source unit 80A is connected through the switch 60A to the first node N1. Similarly, the first node N1 of the internal power-source unit 80B is connected through the switch 60B to the pad 70 for use in voltage applying and monitoring.

Further, the semiconductor integrated circuit device according to the present embodiment is provided with a pad 71 for use in current supplying and current mirror circuits 90A and 90B. The current mirror circuits 90A and 90B are connected to the pad 71 for use in current supplying. The current mirror circuits 90A and 90B are provided for respective of the internal power-source units 80A and 80B.

As shown in FIG. 16, the current mirror circuit 90A is configured by NMOS transistors 91, 92A, and PMOS transistors 93A, 94A. The NMOS transistors 91 and 92A constitute one current mirror circuit, the PMOS transistors 93A and 94A constitute one current mirror circuit, and the two current mirror circuits are connected with each other. The NMOS transistor 91 is connected to the pad 71 for use in current supplying, and the PMOS transistor 94A is provided between the first node N1 of the internal power-source unit 80A and the pad 70 for use in voltage applying and monitoring. In this manner, the current mirror circuit 90A is arranged such that a mirror current equal to a current supplied to the pad 71 flows through the PMOS transistor 94A. In other words, the current mirror circuit 90A is arranged such that the mirror current flows between the first node N1 of the internal power-source unit 80A and the pad 70 for use in voltage applying and monitoring.

Similarly, the current mirror circuit 90B is configured by NMOS transistors 91, 92B, and PMOS transistors 93B, 94B. The NMOS 91 is connected to the pad 71 for use in current supplying, and the PMOS 94B is provided between the first node N1 of the internal power-source unit 80B and the pad 70 for use in voltage applying and monitoring. In this manner, the current mirror circuit 90B is arranged such that the mirror current equal to the current supplied to the pad 71 flows between the first node N1 of the internal power-source unit 80B and the pad 70 for use in voltage applying and monitoring.

In the present embodiment, the trimming operations are executed similarly to the fourth embodiment. That is to say, the switches 60A and 60B are turned ON by the switch open/close signal SW, and the desired potential is applied by using a tester through the pad 70 for use in voltage applying and monitoring. Accordingly, the potential V1 at the first node N1 in each internal power-source unit 80 is fixed to the desired potential. Then, the trimming operations are performed in respective internal power-source units 80, and hence the optimum trimming codes OTC for respective charge pumps 10 are determined (Steps S21 and S22). Since the trimming operations are collectively executed, the time required for the trimming operations is reduced.

Next, the output powers of the internal power-source units 80A and 80B are verified (Step S23). At the step S23, a predetermined current I1 is supplied from the tester to the pad 71 for use in current supplying. The current I1 supplied to the pad 71 for use in current supplying is applied to the current mirror circuits 90A and 90B. At this time, a mirror current of the current I1 flowing through the NMOS 91 may flow through the PMOS transistors 94A and 94B. Typically, the amount of the mirror current is equal to the amount of the current I1. It should be noted that, even if the internal power-source unit 80A (80B) is capable of supplying a current larger than the mirror current to the PMOS transistor 94A (94B), such a current larger than the mirror current does not flow through the PMOS transistor 94A (94B), because the current mirror circuit 90A is provided. It can be said that the current I1 supplied to the pad 71 for use in current supplying controls the amount of the current flowing through the PMOS transistors 94A and 94B.

If the internal power-source unit 80A is capable of supplying to the PMOS transistor 94A a current equivalent to the mirror current, the amount of a current Ia flowing through the PMOS transistor 94A is equal to the amount of the mirror current. Similarly, if the internal power-source unit 80B is capable of supplying to the PMOS transistor 94B a current equivalent to the mirror current, the amount of a current Ib flowing through the PMOS transistor 94B is equal to the amount of the mirror current. On the other hand, if the internal power-source unit 80A is not capable of supplying to the PMOS transistor 94A a current equivalent to the mirror current, the amount of the current Ia flowing through the PMOS transistor 94A is smaller than the amount of the mirror current. Similarly, if the internal power-source unit 80B is not capable of supplying to the PMOS transistor 94B a current equivalent to the mirror current, the amount of the current Ib flowing through the PMOS transistor 94B is smaller than the amount of the mirror current.

During the verification of the output power, the tester is connected to the pad 70 for use in voltage applying and monitoring. The tester controls such that a current two times the mirror current flows through the pad 70 for use in voltage applying and monitoring. In a case when both the internal power-source units 80A and 80B operate normally, no voltage drop occurs at the pad 70 for use in voltage applying and monitoring, because the mirror current flows through the PMOS transistor 94A and the PMOS transistor 94B.

Next, let us consider a case when the charge pump 10 of the internal power-source unit 80A is failed and the internal power-source unit 80A is not capable of supplying the current equivalent to the mirror current to the PMOS transistor 94A. In this case, the current Ia flowing through the PMOS transistor 94A is smaller than the mirror current. Here, the current Ib flowing through the PMOS transistor 94B is controlled by the current I1 applied to the pad 71 for use in current supplying, and thus the current Ib cannot become larger than the mirror current. As a result, a voltage drop is detected at the pad 70 for use in voltage applying and monitoring. In this manner, the voltage drop appears at the pad 70 for use in voltage applying and monitoring, if there is a malfunction in one of or both of the internal power-source units 80.

As described above, the voltage drop occurs at the pad 70 for use in voltage applying and monitoring, if any of the charge pumps 10 has a malfunction. This is because the output power of each internal power-source unit is limited by the current mirror circuit 90. According to the present embodiment, even if a semiconductor chip is provided with a plurality of charge pumps 10, it is not necessary to check the output powers of respective of the plurality of charge pumps 10 one by one. It is possible to judge whether or not there is any malfunction in the charge pumps 10, by checking the presence or absence of the voltage drop. If any malfunction is detected (Step S24; No), the semiconductor chip is rejected as a defective product. In this manner, the time required for the above-mentioned step S23 can be reduced.

According to the present embodiment, the effects as in the fourth embodiment can be obtained. Furthermore, such an additional effect can be obtained as the time required for testing a semiconductor chip provided with a plurality of charge pumps is reduced.

It is apparent that the present invention is not limited to the above embodiment, and that may be modified and changed without departing from the scope and spirit of the invention.

What is claimed is:

1. A power-source potential control circuit, comprising:
   an output terminal outputting a control signal to a power-source generating device which generates a power-source potential in accordance with said control signal;
   an input terminal connected to an output of said power-source generating device;
   a trimming code generating circuit configured to output a trimming code for trimming said power-source potential, wherein a trimming potential varies depending on a first potential at said input terminal and said trimming code; and
   a comparator configured to make a comparison between said trimming potential and a predetermined reference potential and to output a comparison result signal indicative of a result of said comparison as said control signal, said comparison result signal being fed-back to said trimming code generating circuit,
   wherein, in a trimming operation mode, said trimming code generating circuit changes said trimming code in accordance with said comparison result signal.

2. The power-source potential control circuit according to claim 1, wherein said comparator outputs a first signal as said comparison result signal if said predetermined reference potential is higher than said trimming potential, while said comparator outputs a second signal as said comparison result signal if said predetermined reference potential is lower than said trimming potential,
   wherein in said trimming operation mode, when receiving said first signal, said trimming code generating circuit changes said trimming code such that said trimming potential is increased, while when receiving said second signal, said trimming code generating circuit holds said trimming code as of then.

3. The power-source potential control circuit according to claim 1, wherein said comparator outputs a first signal as said comparison result signal if said predetermined reference potential is lower than said trimming potential, while said comparator outputs a second signal as said comparison result signal if said predetermined reference potential is higher than said trimming potential,
   wherein in said trimming operation mode, when receiving said first signal, said trimming code generating circuit changes said trimming code such that said trimming potential is decreased, while when receiving said second signal, said trimming code generating circuit holds said trimming code as of then.

4. The power-source potential control circuit according to claim 2, wherein said trimming code generating circuit includes a counter configured to count clock signals generated by a clock signal generator as long as receiving said first signal, to output a count value as said trimming code, and to stop said count in response to said second signal.

5. The power-source potential control circuit according to claim 2, wherein said trimming code generating circuit includes:
a latch circuit configured to receive said comparison result signal; and
a counter configured to count clock signals generated by a clock signal generator and to output a count value as said trimming code to said latch circuit,
wherein said latch circuit transfers said trimming code as long as receiving said first signal and latches said trimming code in response to said second signal.

6. The power-source potential control circuit according to claim 2, wherein said trimming code generating circuit includes a latch circuit configured to receive said comparison result signal, said trimming code being supplied from a tester to said latch circuit and changing in time,
wherein said latch circuit transfers said trimming code as long as receiving said first signal and latches said trimming code in response to said second signal.

7. The power-source potential control circuit according to claim 1, further comprising:
a trimming circuit configured to change said trimming potential between said first potential and a ground potential in accordance with said trimming code and to output said trimming potential to said comparator,
wherein in said trimming operation mode, said power-source potential is fixed to a predetermined potential by using a pad connected to said input terminal.

8. The power-source potential control circuit according to claim 7, wherein said trimming circuit includes:
a fixed resistance connected between said input terminal and an intermediate node;
a variable resistance connected between said intermediate node and said ground,
wherein a resistance value of said variable resistance changes in accordance with said trimming code, and a potential at said intermediate node is output as said trimming potential.

9. The power-source potential control circuit according to claim 7, wherein said trimming code held by said trimming code generating circuit in said trimming operation mode comprises an optimum trimming code, and said trimming code generating circuit outputs said optimum trimming code to said trimming circuit in a normal operation mode.

10. The power-source potential control circuit according to claim 1, wherein said power-source generating device comprises a charge pump which operates in accordance with said control signal.

11. A semiconductor integrated circuit device comprising:
a first pad; and
a plurality of power-source units each of which generates an internal potential and comprising:
a first node connected to said first pad;
a trimming code generating circuit configured to output a trimming code for trimming said internal potential;
a trimming circuit configured to output a trimming potential which varies between a potential at said first node and a ground potential in accordance with said trimming code; and
a comparator associated with the trimming code generating circuit and the trimming circuit and configured to make a comparison between said trimming potential and a predetermined reference potential and to output a comparison result signal indicative of a result of said comparison, said comparison result signal being fed-back to said trimming code generating circuit,
wherein in a trimming operation mode, said potential at said first node of said each power-source unit is fixed to a predetermined potential by said first pad, and said trimming code generating circuit changes said trimming code in accordance with said comparison result signal.

12. The semiconductor integrated circuit device according to claim 11,
wherein said comparator outputs a first signal as said comparison result signal if said predetermined reference potential is higher than said trimming potential, while said comparator outputs a second signal as said comparison result signal if said predetermined reference potential is lower than said trimming potential,
wherein in said trimming operation mode, when receiving said first signal, said trimming code generating circuit changes said trimming code such that said trimming potential is increased, while when receiving said second signal, said trimming code generating circuit holds said trimming code as of then.

13. The semiconductor integrated circuit device according to claim 11,
wherein said comparator outputs a first signal as said comparison result signal if said predetermined reference potential is lower than said trimming potential, while said comparator outputs a second signal as said comparison result signal if said predetermined reference potential is higher than said trimming potential,
wherein in said trimming operation mode, when receiving said first signal, said trimming code generating circuit changes said trimming code such that said trimming potential is decreased, while when receiving said second signal, said trimming code generating circuit holds said trimming code as of then.

14. The semiconductor integrated circuit device according to claim 12, wherein said trimming code generating circuit includes a counter configured to count clock signals generated by a clock signal generator as long as receiving said first signal, to output a count value as said trimming code, and to stop said count in response to said second signal.

15. The semiconductor integrated circuit device according to claim 12, wherein said trimming code generating circuit includes:
a latch circuit configured to receive said comparison result signal; and
a counter configured to count clock signals and to output a count value as said trimming code to said latch circuit,
wherein said latch circuit transfers said trimming code as long as receiving said first signal and latches said trimming code in response to said second signal.

16. The semiconductor integrated circuit device according to claim 11, further comprising:
a second pad operatively coupled to said first node and to which a predetermined current is supplied; and
a plurality of current mirror circuits connected to said second pad, wherein respective ones of said plurality of current mirror circuits are arranged such that a mirror current equal to said predetermined current flows through said first node of respective ones of said plurality of power-source units.

17. The semiconductor integrated circuit device according to claim 16, wherein a current, which is a number of said plurality of power-supply units times said mirror current, flows through said first pad at a time when output powers of said plurality of power-supply units are measured.

* * * * *